US011139278B2

(12) United States Patent
Niu et al.

(10) Patent No.: US 11,139,278 B2
(45) Date of Patent: Oct. 5, 2021

(54) LOW PARASITIC INDUCTANCE POWER MODULE AND DOUBLE-FACED HEAT-DISSIPATION LOW PARASITIC INDUCTANCE POWER MODULE

(71) Applicant: YANGZHOU GUOYANG ELECTRONIC CO., LTD., Jiangsu (CN)

(72) Inventors: Ligang Niu, Jiangsu (CN); Yulin Wang, Jiangsu (CN); Hesong Teng, Jiangsu (CN); Wenhui Xu, Jiangsu (CN)

(73) Assignee: YANGZHOU GUOYANG ELECTRONIC CO., LTD., Jiangsu (CN)

( * ) Notice: Subject to any disclaimer, the term of this patent is extended or adjusted under 35 U.S.C. 154(b) by 94 days.

(21) Appl. No.: 16/621,700

(22) PCT Filed: Jun. 27, 2017

(86) PCT No.: PCT/CN2017/090248
§ 371 (c)(1),
(2) Date: Dec. 12, 2019

(87) PCT Pub. No.: WO2018/227655
PCT Pub. Date: Dec. 20, 2018

(65) Prior Publication Data
US 2021/0151416 A1 May 20, 2021

(30) Foreign Application Priority Data
Jun. 14, 2017 (CN) .......................... 201710448407.4

(51) Int. Cl.
*H01L 25/07* (2006.01)
*H01L 23/538* (2006.01)
(Continued)

(52) U.S. Cl.
CPC .......... *H01L 25/071* (2013.01); *H01L 23/051* (2013.01); *H01L 23/142* (2013.01);
(Continued)

(58) Field of Classification Search
CPC ... H01L 25/071; H01L 23/051; H01L 23/142; H01L 23/3121; H01L 23/3672;
(Continued)

(56) References Cited

U.S. PATENT DOCUMENTS

| 9,041,183 B2 | 5/2015 | Liang et al. | |
| 2013/0015495 A1* | 1/2013 | Hauenstein | ........... H01L 25/071 257/140 |
| 2014/0327436 A1* | 11/2014 | Castro Serrato | ........ H01L 24/37 324/252 |

FOREIGN PATENT DOCUMENTS

| CN | 105161467 | 12/2015 |
| CN | 105161477 | 12/2015 |

(Continued)

OTHER PUBLICATIONS

"International Search Report (Form PCT/ISA/210) of PCT/CN2017/090248," dated Mar. 19, 2018,with English translation thereof, pp. 1-4.

*Primary Examiner* — Peniel M Gumedzoe
(74) *Attorney, Agent, or Firm* — JCIPRNET

(57) ABSTRACT

A low parasitic inductance power module, which includes an input power terminal, an output power terminal, a top metal insulating substrate, a bottom metal insulating substrate and a plastic package shell, wherein the input power terminal includes a positive power terminal and a negative power terminal, the top metal insulating substrate and the bottom metal insulating substrate are stacked, chips are sintered on faces of both the top metal insulating substrate and the bottom metal insulating substrate opposite to each other, and the positive power terminal, the negative power terminal, (Continued)

and the output power terminal are all electrically connected with the chips; and the output power terminal includes a welding portion and a connecting portion located outside the plastic package shell, and the welding portion is located between the top metal insulating substrate and the bottom metal insulating substrate.

19 Claims, 20 Drawing Sheets

(51) Int. Cl.
*H01L 23/498* (2006.01)
*H01L 23/051* (2006.01)
*H01L 23/49* (2006.01)
*H01L 23/31* (2006.01)
*H01L 23/367* (2006.01)
*H01L 23/427* (2006.01)
*H01L 23/14* (2006.01)

(52) U.S. Cl.
CPC ...... *H01L 23/3121* (2013.01); *H01L 23/3672* (2013.01); *H01L 23/427* (2013.01); *H01L 23/49* (2013.01); *H01L 23/49811* (2013.01); *H01L 23/5385* (2013.01)

(58) Field of Classification Search
CPC . H01L 23/472; H01L 23/49; H01L 23/49811; H01L 23/5385
See application file for complete search history.

(56) References Cited

FOREIGN PATENT DOCUMENTS

| | | |
|---|---|---|
| CN | 106486431 | 3/2017 |
| CN | 106561076 | 4/2017 |

* cited by examiner

LOW PARASITIC INDUCTANCE POWER MODULE AND DOUBLE-FACED HEAT-DISSIPATION LOW PARASITIC INDUCTANCE POWER MODULE

CROSS-REFERENCE TO RELATED APPLICATION

This application is a 371 of international application of PCT application serial no. PCT/CN2017/090248, filed on Jun. 27, 2017, which claims the priority benefit of China application no. 201710448407.4, filed on Jun. 14, 2017. The entirety of each of the above mentioned patent applications is hereby incorporated by reference herein and made a part of this specification.

BACKGROUND

Technical Field

The present invention relates to a power module in power electronics, and more particularly, to a low parasitic inductance power module and a double-faced heat-dissipation low parasitic inductance power module.

Description of Related Art

A power electronics technology plays a very important role in the rapidly developed industrial field today. As a representative of the power electronics technology, a power module in power electronics has been widely used in electromobiles, photovoltaic power generation, wind power generation, industrial frequency conversion and other industries. With the rise of industry of China, the power module in power electronics has a broader market prospect.

The present power module in power electronics has a large package volume and a heavy weight, which does not meet the requirements of high power density and light weight in the fields of electromobiles, aerospace and the like. The power module in power electronics with a larger volume often has a larger parasitic inductance, which will result in a larger overshoot voltage and increase losses, and also limit the application of the power module in a high switching frequency occasion. A SiC power electronic device has the characteristics of high frequency, high temperature and high efficiency, but the present power module has a larger parasitic inductance, which limits the performance implementation of the SiC. In addition, with the continuous upgrading of the power density at an application end, a package structure of the present power module has hindered the further improvement of the power density, and a more effective heat dissipation structure has to be developed to meet the increasing demand of the power density.

Regarding a present double-faced heat-dissipation power module, such as CN105161477A, due to single-layer arrangement of chips, an area of a commutating loop is still larger, and a parasitic inductance is often larger. Moreover, due to the single-layer arrangement of the chips, the power module has a larger volume. In addition, a power terminal and a control terminal are only connected with a first lining plate, so that the arrangement is not flexible enough, an area of the lining plate cannot be further reduced, and losses are increased due to a long current path.

SUMMARY

Object of the present invention: aiming at the defects in the prior art, the present invention is intended to provide a low parasitic inductance power module with small volume, light weight and small parasitic inductance, and a double-sided heat-dissipation low parasitic inductance power module.

Technical solutions: a low parasitic inductance power module includes an input power terminal, an output power terminal, a top metal insulating substrate, a bottom metal insulating substrate and a plastic package shell, wherein the input power terminal includes a positive power terminal and a negative power terminal, the top metal insulating substrate and the bottom metal insulating substrate are stacked, chips are sintered on faces of both the top metal insulating substrate and the bottom metal insulating substrate opposite to each other, and the positive power terminal, the negative power terminal, and the output power terminal are all electrically connected with the chips; and the output power terminal includes a welding portion and a connecting portion located outside the plastic package shell, and the welding portion is located between the top metal insulating substrate and the bottom metal insulating substrate.

Further, an upper half-bridge switch chip and an upper half-bridge diode chip are sintered on the bottom metal insulating substrate, and a lower half-bridge switch chip and a lower half-bridge diode chip are sintered on the top metal insulating substrate; and the upper half-bridge switch chip and the lower half-bridge diode chip are stacked, and the lower half-bridge switch chip and the upper half-bridge diode chip are stacked.

Further, the positive power terminal is sintered on the bottom metal insulating substrate, and the negative power terminal is sintered on the top metal insulating substrate; and the welding portion is located between the chip sintered on the top metal insulating substrate and the chip sintered on the bottom metal insulating substrate.

Further, the positive power terminal is sintered on the bottom metal insulating substrate, the negative power terminal is sintered on the top metal insulating substrate, the bottom metal insulating substrate or the top metal insulating substrate is provided with an output local metal layer, the output power terminal is connected with a chip connecting block through the output local metal layer, and the chip connecting block is electrically connected with the chip on the bottom metal insulating substrate and the chip on the top metal insulating substrate.

Further, the chips sintered on the top metal insulating substrate are a lower half-bridge diode chip and an upper half-bridge diode chip, the chips sintered on the bottom metal insulating substrate are a lower half-bridge switch chip and an upper half-bridge switch chip, wherein the lower half-bridge diode chip and the upper half-bridge switch chip are stacked, and the lower half-bridge diode chip and the upper half-bridge switch chip are stacked.

Further, the positive power terminal and the negative power terminal are both sintered on the top metal insulating substrate, and at least one input power terminal is connected with the bottom metal insulating substrate through a metal joint pin; or, the positive power terminal and the negative power terminal are both sintered on the bottom metal insulating substrate, and are connected with the top metal insulating substrate through a metal joint pin; or, the positive power terminal and the negative power terminal are sintered together with the top metal insulating substrate and the bottom metal insulating substrate; and the welding portion is located between the chip sintered on the top metal insulating substrate and the chip sintered on the bottom metal insulating substrate.

Further, the welding portion is sintered with the upper half-bridge switch chip and the upper half-bridge diode chip on one face facing the bottom metal insulating substrate, and is sintered with the lower half-bridge switch chip and the lower half-bridge diode chip on one face facing the top metal insulating substrate.

Further, the bottom metal insulating substrate is provided with a surface metal layer of the bottom metal insulating substrate, the upper half-bridge switch chip and the upper half-bridge diode chip are sintered on the surface metal layer of the bottom metal insulating substrate, when the upper half-bridge switch chip is an IGBT, the positive power terminal is electrically connected with a collector electrode of the upper half-bridge switch chip and a negative electrode of the upper half-bridge diode chip, and when the upper half-bridge switch chip is a MOSFET, the positive power terminal is electrically connected with a drain electrode of the upper half-bridge switch chip and the negative electrode of the upper half-bridge diode chip;

the top metal insulating substrate is provided with a surface metal layer of the top metal insulating substrate, a first upper half-bridge driving local metal layer and a second upper half-bridge driving local metal layer, the lower half-bridge switch chip and the lower half-bridge diode chip are sintered on the surface metal layer of the top metal insulating substrate, the first upper half-bridge driving local metal layer and the second upper half-bridge driving local metal layer are respectively connected with an upper half-bridge driving terminal, a gate electrode of the upper half-bridge switch chip is electrically connected with the first upper half-bridge driving local metal layer, and the output power terminal is electrically connected with the second upper half-bridge driving local metal layer; and the top metal insulating substrate is further provided with a lower half-bridge driving local metal layer, the lower half-bridge driving local metal layer is connected with a gate electrode of the lower half-bridge switch chip, the other end of the lower half-bridge driving local metal layer is connected with a lower half-bridge driving terminal, and the surface metal layer of the top metal insulating substrate is also connected with a lower half-bridge driving terminal.

Further, the chip connecting block is sintered with the upper half-bridge switch chip and the upper half-bridge diode chip on one face facing the bottom metal insulating substrate, and is sintered with the lower half-bridge switch chip and the lower half-bridge diode chip on one face facing the top metal insulating substrate.

Further, the chip connecting block is divided into a first chip connecting block and a second chip connecting block, and both the first chip connecting block and the second chip connecting block are sintered with the output local metal layer; the first chip connecting block is sintered with the lower half-bridge diode chip on one face facing the top metal insulating substrate, and is sintered with the upper half-bridge switch chip on one face facing the bottom metal insulating substrate; and the second chip connecting block is sintered with the lower half-bridge switch chip on one face facing the top metal insulating substrate, and is sintered with the upper half-bridge diode chip on one face facing the bottom metal insulating substrate.

Further, the bottom metal insulating substrate is provided with an upper half-bridge surface metal layer and the output local metal layer, the upper half-bridge switch chip and the upper half-bridge diode chip are sintered on the upper half-bridge surface metal layer, when the upper half-bridge switch chip is an IGBT, the positive power terminal is electrically connected with a collector electrode of the upper half-bridge switch chip and a negative electrode of the upper half-bridge diode chip, and when the upper half-bridge switch chip is a MOSFET, the positive power terminal is electrically connected with a drain electrode of the upper half-bridge switch chip and a negative electrode of the upper half-bridge diode chip; the top metal insulating substrate is provided with a lower half-bridge surface metal layer, a lower half-bridge driving local metal layer, a first upper half-bridge driving local metal layer and a second upper half-bridge driving local metal layer, the lower half-bridge switch chip and the lower half-bridge diode chip are sintered on the lower half-bridge surface metal layer, the lower half-bridge surface metal layer and the lower half-bridge driving local metal layer are respectively connected with a lower half-bridge driving terminal, and the first upper half-bridge driving local metal layer and the second upper half-bridge driving local metal layer are respectively connected with an upper half-bridge driving terminal; and when the lower half-bridge switch chip is an IGBT, the lower half-bridge surface metal layer is connected with an emitter electrode of the IGBT chip; and when the lower half-bridge switch chip is a MOSFET, the lower half-bridge surface metal layer is connected with a source electrode of the MOSFET chip, the lower half-bridge driving local metal layer is connected with a gate electrode of the lower half-bridge switch chip, the first upper half-bridge driving local metal layer is connected with a gate electrode of the upper half-bridge switch chip, and the second upper half-bridge driving local metal layer is connected with the welding portion of the output power terminal.

Further, the top metal insulating substrate includes a positive metal layer of the top metal insulating substrate electrically connected with the positive power terminal, a negative metal layer of the top metal insulating substrate electrically connected with the negative power terminal, an emitting/source electrode local metal layer of the upper half-bridge switch chip electrically connected with the output power terminal and one upper half-bridge driving terminal, and a gate electrode local metal layer of the upper half-bridge switch chip electrically connected with another upper half-bridge driving terminal;

the upper half-bridge diode chip is sintered on a surface of the positive metal layer of the top metal insulating substrate, the lower half-bridge diode chip is sintered on a surface of the negative metal layer of the top metal insulating substrate, and the gate electrode local metal layer of the upper half-bridge switch chip is electrically connected with a gate electrode of the upper half-bridge switch chip;

the bottom metal insulating substrate includes a positive metal layer of the bottom metal insulating substrate electrically connected with the positive power terminal, a negative metal layer of the bottom metal insulating substrate electrically connected with the negative power terminal and one lower half-bridge driving terminal, and a gate electrode local metal layer of the lower half-bridge switch chip electrically connected with another lower half-bridge driving terminal; and the upper half-bridge switch chip is sintered on a surface of the positive metal layer of the bottom metal insulating substrate, and the lower half-bridge switch chip is sintered on a surface of the negative metal layer of the bottom metal insulating substrate; and the gate electrode local metal layer of the lower half-bridge switch chip is electrically connected with a gate electrode of the lower half-bridge switch chip.

Further, the output power terminal further includes an upper half-bridge leading-out terminal, the welding portion is connected with an emitter electrode or a source electrode of the upper half-bridge switch chip, connected with a collector electrode or a drain electrode of the lower half-bridge switch chip, connected with a positive electrode of the upper half-bridge diode chip, and connected with a negative electrode of the lower half-bridge diode chip; and the upper half-bridge leading-out terminal is connected with an emitting/source electrode local metal layer of the upper half-bridge switch chip of the top metal insulating substrate.

Further, the welding portion of the output power terminal is a matrix at a position contacted with the chip, and is a three-layer structure at a position not contacted with the chip, the matrix is located in the middle layer, and fillers are located at upper and lower sides.

Further, a stress buffer layer is filled between the welding portion of the output power terminal and the chip.

Further, the plastic package shell is manufactured by a transfer mold integrated molding process, and a middle part of an upper surface on a back metal layer of the top metal insulating substrate and a middle part of a lower surface of a back metal layer of the bottom metal insulating substrate are both exposed outside the plastic package shell, and are higher than the plastic package shell.

A double-faced heat-dissipation low parasitic inductance power module includes the low parasitic inductance power module as mentioned above, wherein a lower surface of the low parasitic inductance power module is provided with a heat radiator, an upper surface of the low parasitic inductance power module is provided with a plurality of heat pipes, the heat radiator is provided with a heat pipe insertion opening, the heat pipe includes an evaporation section, the evaporation section is bent downwardly at an edge of the power module to form a connecting section, and the connecting section is inserted into the heat pipe insertion opening of the heat radiator and fixed.

Further, the evaporation section of the heat pipe is sintered on the top metal insulating substrate; the evaporation section is wrapped in the plastic package shell; or, the evaporation section is exposed outside the plastic package shell, and the middle part of the upper surface of the top metal insulating substrate and the middle part of the lower surface of the bottom metal insulating substrate are exposed outside the plastic package shell.

Further, the lower surface of the bottom metal insulating substrate is provided with a turbulence structure, an upper surface of the heat radiator is provided with a turbulence hole, the turbulence structure extends into the heat radiator through the turbulence hole and is sealed at an opening of the turbulence hole, to form a heat exchange channel for heat dissipation media in the heat radiator.

Beneficial effects: according to the present invention, the top metal insulating substrate and the bottom metal insulating substrate are stacked, the chips are sintered on the faces of both the top metal insulating substrate and the bottom metal insulating substrate opposite to each other, and the welding portion of the output power terminal is also arranged between the top metal insulating substrate and the bottom metal insulating substrate; in this way, the stacked arrangement of the chips and the electrodes can greatly reduce a parasitic inductance of a loop, decrease a volume of the power module, save costs, lighten a weight, and is particularly suitable for packaging a SiC power chip; meanwhile, the power terminals of the chips in the power module all adopt a large-area sintering structure, thus greatly reducing the module failure risk caused by the failure of bonding wires when the bonding wires are used, fully improving an overcurrent capability and improving a reliability of the module. In addition, heat sinks may be arranged on both sides of the power module, so that the thermal resistance of the power module can be reduced, or the heat sink may be arranged at the bottom of the power module, and the top of the of the power module is connected to the heat sink by the heat pipe for double-faced heat dissipation, so that the structure of the heat radiator can be further simplified and the volume of the heat radiator can be compressed while the heat dissipation efficiency of the power module is ensured.

DESCRIPTION OF THE EMBODIMENTS

The technical solutions will be further described hereinafter in detail with reference to the embodiments and drawings.

Embodiment 1

According to the invention, a switch chip and a freewheel diode chip of a relative bridge arm are stacked, so that a commutating loop path is shortest, thereby greatly reducing a parasitic inductance of the loop. The purpose of double-faced heat dissipation is achieved by arranging heat dissipation paths on both sides of the stacked chips, thus further reducing a thermal resistance of a power module.

Figure 1:
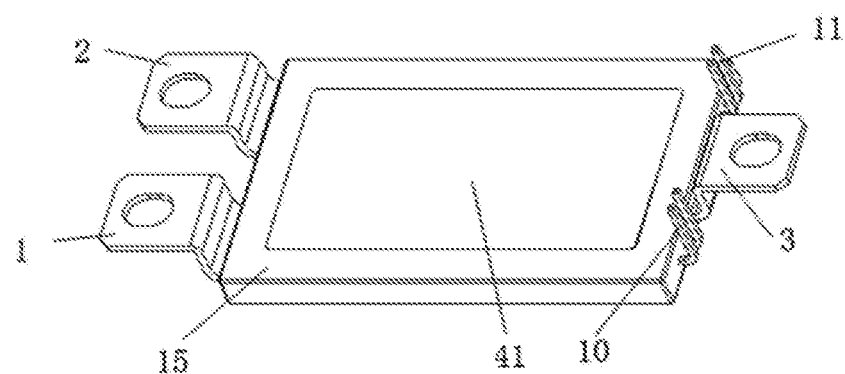
FIG. 1 is a structural drawing illustrating an overall appearance of Embodiment 1.
Figure 2:
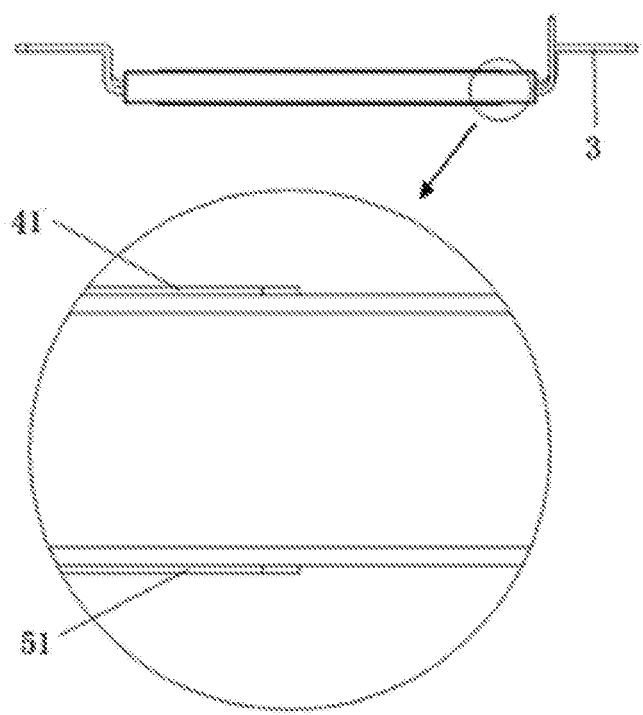
FIG. 2 is a front view and a partial enlarged drawing of Embodiment 1.

As shown in FIG. 1, a double-faced heat-dissipation low parasitic inductance power module includes a positive power terminal 1, a negative power terminal 2, an output power terminal 3, a bottom metal insulating substrate 5 connected with the positive power terminal 1, a top metal insulating substrate 4 connected with the negative power terminal 2, an upper half-bridge driving terminal 10, a lower half-bridge driving terminal 11 and a plastic package shell 15 used for encapsulating. The positive power terminal 1 in the embodiment is sintered on the bottom metal insulating substrate 5, and the negative power terminal 2 is sintered on the top metal insulating substrate 4. The two power terminals may also be sintered on the same substrate, and then connected to another substrate by a metal connecting block or other connecting method, so that the positive power terminal 1 is electrically connected with a chip on the bottom metal insulating substrate 5 and the negative power terminal 2 is electrically connected with a chip on the top metal insulating substrate 4. In addition, the metal insulating substrates adopted as the top metal insulating substrate 4 and the bottom metal insulating substrate 5 in the embodiment are both DBCs, i.e., the top metal insulating substrate 4 includes an insulating substrate and metal layers at two sides of the substrate. One face of the top metal insulating substrate 4 facing the bottom metal insulating substrate 5 is installed with a chip, and the other face not installed with a chip is a back metal layer 41 of the top metal insulating substrate. Similarly, the bottom metal insulating substrate 5 also has the same structure, and one face of the bottom metal insulating substrate 5 not installed with a chip is a back metal layer 51 of the bottom metal insulating substrate. Those skilled in the art may not adopt the DBC structure when implementing, and may also adopt a structure in which two sides of the insulating substrate are covered with aluminum, or one side of the insulating substrate is covered with copper and the other side is covered with aluminum and other metals covering two sides of an insulating medium. The plastic package shell 15 is manufactured by a transfer mold integrated molding process, i.e., molten thermosetting plastic is injected into a mold cavity by a plastic package press, a sintered semi-finished power module is placed in the mold cavity, and the molten thermosetting plastic is quickly solidified and molded after reaching a curing temperature to form the plastic package shell 15 shown in the design solution of the present invention. A middle part of an upper surface on the back metal layer 41 of the top metal insulating substrate and a middle part of a lower surface of the back metal layer 51 of the bottom metal insulating substrate are both exposed outside the plastic package shell 15, and are higher than the plastic package shell 15. As shown in FIG. 2, this structure can make the back metal layer of the metal insulating substrate better contact with the heat radiator and can realize a better heat dissipation effect.

Figure 3:
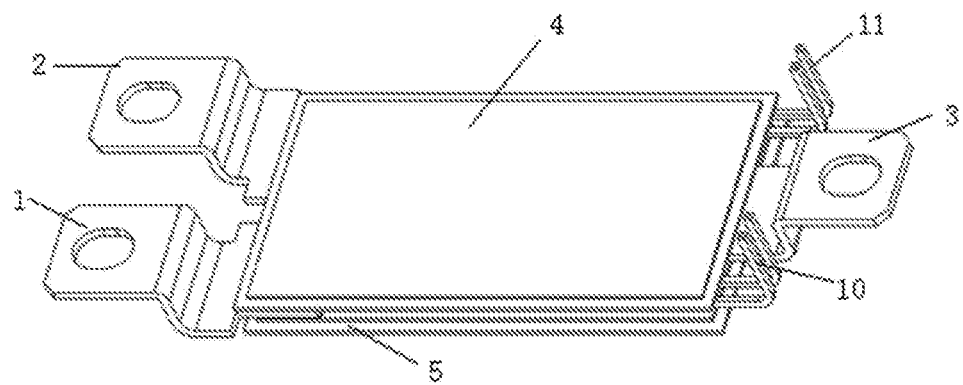
FIG. 3 is a schematic diagram illustrating an interior of Embodiment 1.

As shown in FIG. 3, in the power module, the top metal insulating substrate 4 and the bottom metal insulating substrate 5 are stacked in a parallel and facing structure. In the embodiment, the top metal insulating substrate 4 is the metal insulating substrate connected with the negative power terminal 2, and the bottom metal insulating substrate 5 is the metal insulating substrate connected with the positive power terminal 1. Component positions of the top metal insulating substrate 4 and component positions of the bottom metal insulating substrate 5 may also be exchanged, without affecting the effect of the design solution. Chip are sintered on the faces of both the top metal insulating substrate 4 and the bottom metal insulating substrate 5 opposite to each other. The output power terminal 3 includes a welding portion 31 and a connecting portion 32 located outside the plastic package shell 15. The connecting portion 32 in the embodiment is provided with a mounting hole. The welding portion 31 is located between the chip sintered on the top metal insulating substrate 4 and the chip sintered on the bottom metal insulating substrate 5. The welding portion 31 in this embodiment is of a planar structure. One end of the welding portion 31 is bent and extends upwardly to form a connecting portion having a mounting hole. During specific application, the welding portion 31 may be made into a whole slabbed structure without bending according to actual needs.

Figure 4:
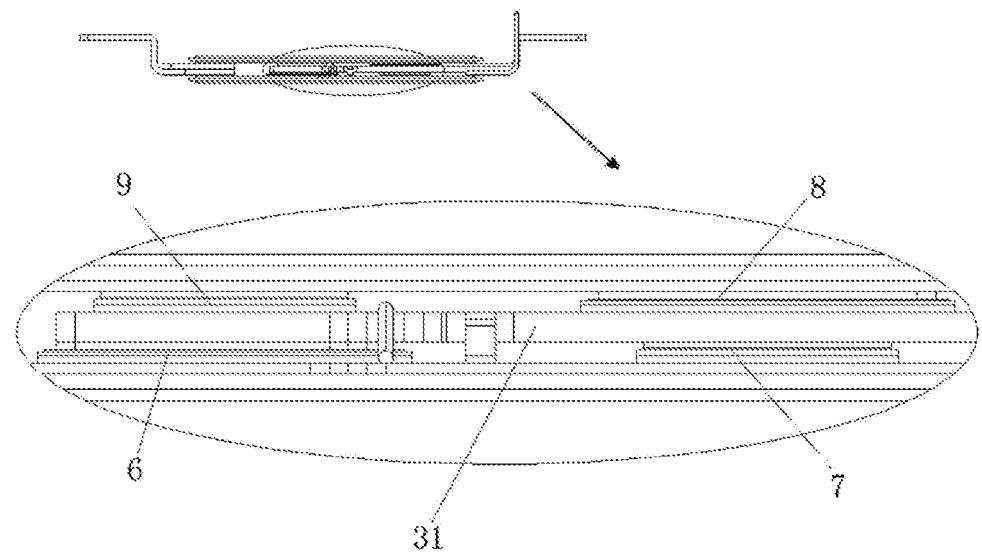
FIG. 4 is a front view and a partial enlarged drawing illustrating the interior of Embodiment 1.

The layout of the chips in the power module is shown in FIG. 4. The chips are arranged in a stacked structure. In the embodiment, the bottom metal insulating substrate 5 is sintered with an upper half-bridge switch chip 6 and an upper half-bridge diode chip 7 on one face facing the top metal insulating substrate 4, while the top metal insulating substrate 4 is sintered with a lower half-bridge switch chip 8 and a lower half-bridge diode chip 9 on one face facing the bottom metal insulating substrate 5. Specifically, the bottom metal insulating substrate 5 is provided with the upper half-bridge switch chip, the welding portion 31 of the output power terminal 3 is sintered on an upper surface of an upper half-bridge power chip, the output power terminal 3 is sintered with the lower half-bridge diode chip 9, the upper half-bridge switch chip and the lower half-bridge diode chip 9 are stacked, the lower half-bridge diode chip 9 is located above the upper half-bridge switch chip, and an upper surface of the lower half-bridge diode is sintered with the top metal insulating substrate 4. Similarly, the bottom metal insulating substrate 5 is further provided with the upper half-bridge diode chip 7, the welding portion 31 of the output power terminal 3 is sintered with the upper half-bridge switch chip 6 and the upper half-bridge diode chip 7 on one face facing the bottom metal insulating substrate 5, and is sintered with the lower half-bridge switch chip 8 and the lower half-bridge diode chip 9 on one face facing the top metal insulating substrate 4. Specifically, the welding portion 31 of the output power terminal 3 is sintered on an upper surface of the upper half-bridge diode chip 7, the output power terminal 3 is further sintered with the lower half-bridge switch chip, the lower half-bridge switch chip 8 and the lower upper half-bridge diode chip 7 are stacked, the lower half-bridge switch chip 8 is located above the upper half-bridge diode chip 7, and an upper surface of the lower half-bridge switch chip 8 is also sintered with the top metal insulating substrate 4.

Figure 5:
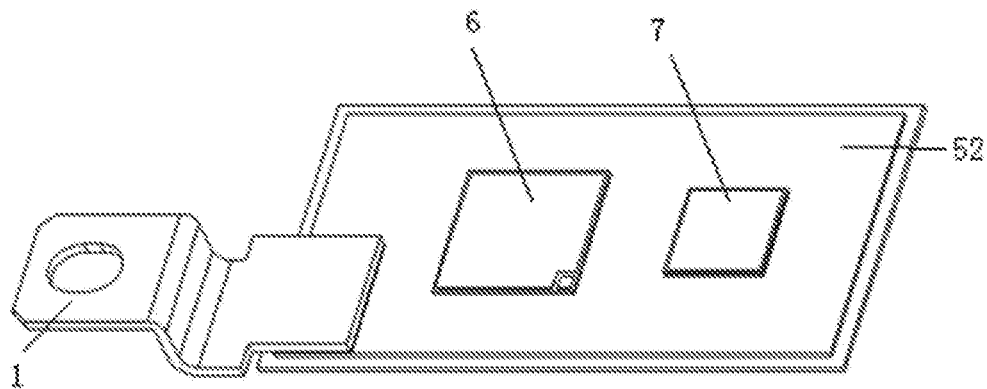
FIG. 5 is a schematic diagram illustrating components of a bottom metal insulating substrate of Embodiment 1.
Figure 6:
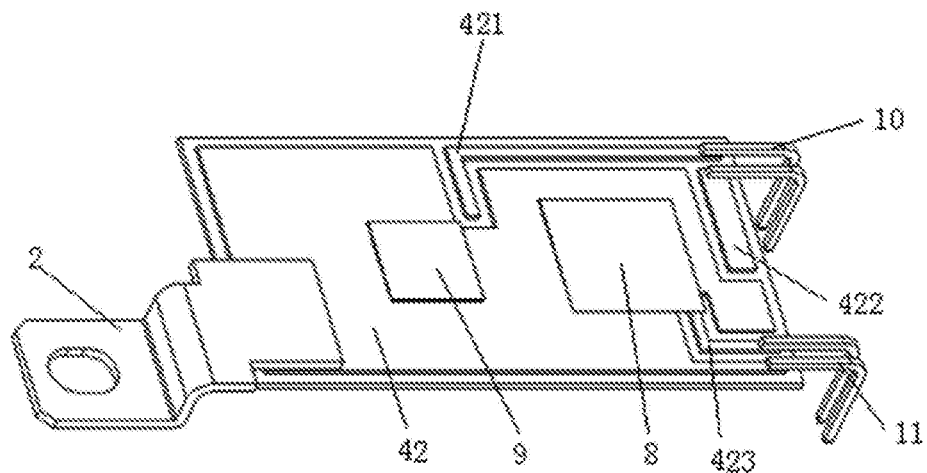
FIG. 6 is a schematic diagram illustrating components of a top metal insulating substrate of Embodiment 1.

In order to further illustrate the position and connecting structure of the chips, structures of the upper half-bridge metal insulating substrate components and the lower half-bridge metal insulating substrate components are respectively explained, as shown in FIG. 5 and FIG. 6. In FIG. 5, the positive power terminal is sintered on a surface of a metal layer of the bottom metal insulating substrate 5, and the bottom metal insulating substrate 5 is provided with a surface metal layer 52 of the bottom metal insulating substrate. The upper half-bridge switch chip 6 and the upper half-bridge diode chip 7 are sintered on the surface metal layer 52 of the bottom metal insulating substrate. When the upper half-bridge switch chip is an IGBT, the positive power terminal 1 is electrically connected with a collector electrode of the upper half-bridge switch chip 6 and a negative electrode of the upper half-bridge diode chip 7. When the upper half-bridge switch chip 6 is a MOSFET, the positive power terminal 1 is electrically connected with a drain electrode of the upper half-bridge switch chip 6 and the negative electrode of the upper half-bridge diode chip 7.

In FIG. 6, the negative power terminal is sintered on a surface of a metal layer of the top metal insulating substrate 4, and the top metal insulating substrate 4 is provided with a surface metal layer 42 of the top metal insulating substrate, a first upper half-bridge driving local metal layer 421 and a second upper half-bridge driving local metal layer 422. The lower half-bridge switch chip 8 and the lower half-bridge diode chip 9 are sintered on the surface metal layer 42 of the top metal insulating substrate. The first upper half-bridge driving local metal layer 421 and the second upper half-bridge driving local metal layer 422 are respectively connected with an upper half-bridge driving terminal 10. A gate electrode of the upper half-bridge switch chip 6 is electrically connected with the first upper half-bridge driving local metal layer 421, and the output power terminal 3 is electrically connected with the second upper half-bridge driving local metal layer 422.

The top metal insulating substrate 4 is further provided with a lower half-bridge driving local metal layer 423. The lower half-bridge driving local metal layer 423 is connected with a gate electrode of the lower half-bridge switch chip 8, and the other end of the lower half-bridge driving local metal layer 423 is connected with a lower half-bridge driving terminal 11. The surface metal layer 42 of the top metal insulating substrate is also connected with a lower half-bridge driving terminal 11.

Figure 7:
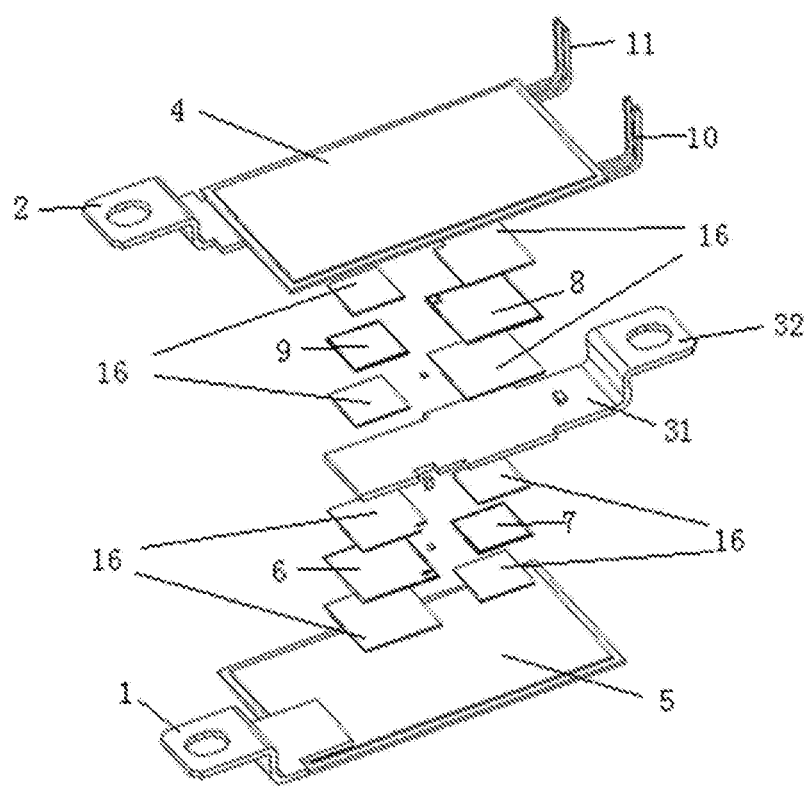
FIG. 7 is an explosion schematic diagram of Embodiment 1.

FIG. 7 shows a relationship between layers in the power module. The sintering in the embodiment is specifically performed by sintering via a pad layer 16. Since the upper and lower surfaces of the switch chip are plated or sputtered or evaporated with a metal structure of titanium, nickel, silver, etc., the pad layer 16 may be a pad layer 16 formed by sintering solders such as tin and lead, or a pad layer 16 formed by sintering silver paste. In addition, the gate electrode of the upper half-bridge switch chip 6 and the first upper half-bridge driving local metal layer 421, and the output power terminal 3 and the second upper half-bridge driving local metal layer 422 are all electrically connected by using a metal connecting block. The metal block may be made of metal materials such as molybdenum, tungsten copper and the like which are relatively matched with thermal expansion coefficients of the chips. If the connection mode of the metal connecting blocks is not adopted, bonding wires may also be used for connection.

Figure 8:
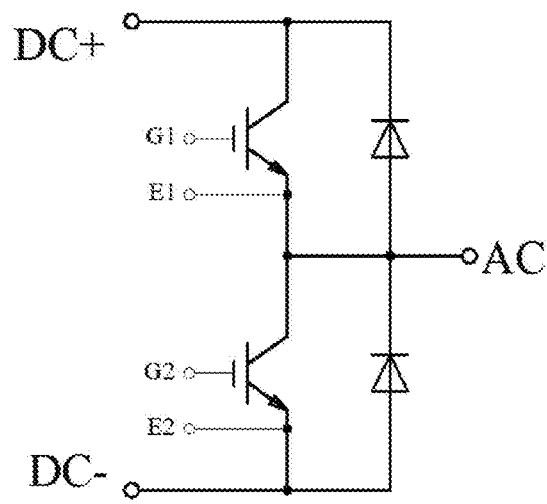
FIG. 8 is a schematic diagram illustrating a topological structure and a commutating loop of a conventional half-bridge power module.
Figure 9:
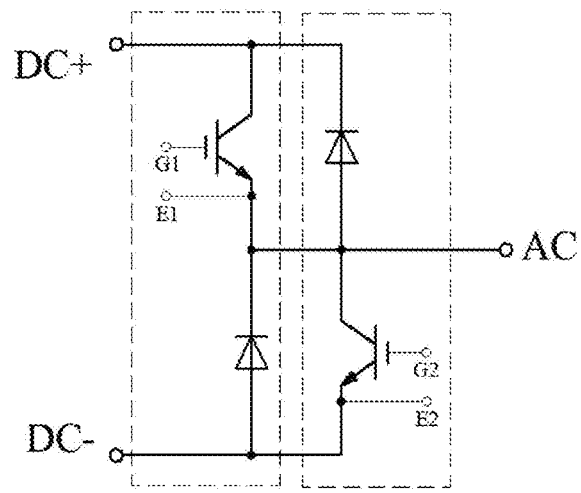
FIG. 9 is a schematic diagram illustrating a topological structure and a commutating loop of a half-bridge power module of Embodiment 1.

FIG. 8 and FIG. 9 respectively show a conventional half-bridge topological structure and a half-bridge topological structure of the present invention. In the conventional power module, the collector electrode or the drain electrode of the switch chip is connected with the surface metal layer of the metal insulating substrate through the pad layer 16, and the emitter electrode or the source electrode of the switch chip is connected with the surface metal layer through the bonding wire, i.e., the upper half-bridge switch chip 6 and the lower half-bridge diode chip 9 are connected through the bonding wire and the metal layer, and heavy lines in the figures indicate freewheel loop paths. According to the present invention, the upper half-bridge switch chip 6 and the lower half-bridge diode chip 9 are stacked, so that the metal layer of the metal insulating substrate and the bonding wire in the middle are omitted, and the connection path is shortest, so that a commutating loop of the present invention is shortest, and parasitic inductance is greatly reduced.

Figure 10:
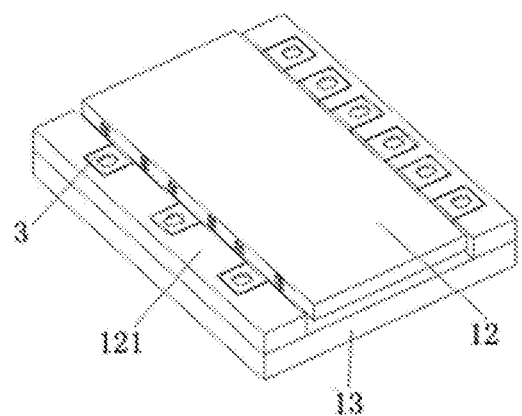
FIG. 10 is a schematic diagram illustrating a heat dissipation solution of a three-phase-bridge power module.
Figure 11:
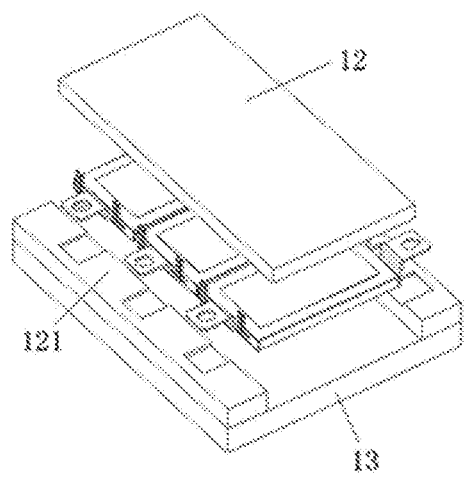
FIG. 11 is an exploded view illustrating installation of the three-phase-bridge power module.

FIG. 10 and FIG. 11 are schematic diagrams illustrating connection between the power module and the heat radiator. The back metal layer 41 of the top metal insulating substrate and the back metal layer 51 of the bottom metal insulating substrate are respectively provided with a first heat radiator 12 and a second heat radiator 13. The back metal layer 41 of the top metal insulating substrate is contacted with the first heat radiator 12 through heat conductive silicone grease or other heat conductive materials. The back metal layer 51 of the bottom metal insulating substrate is also contacted with the second heat radiator 13 through heat conductive silicone grease or other heat conductive materials. Insulating pads 121 are installed at two sides of the second heat radiator 13, and the insulating pads 121 are contacted with the positive/negative power terminals of the power module to facilitate the installation of bus bars.

Figure 12:
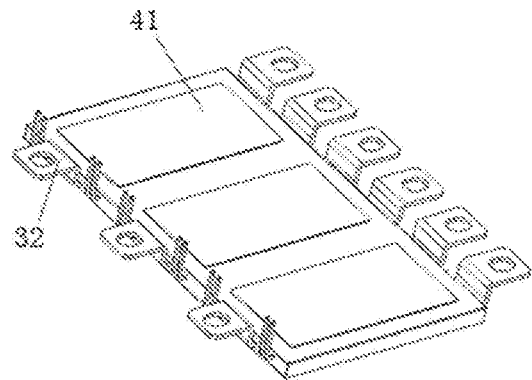
FIG. 12 is a schematic diagram illustrating an entire structure of the three-phase-bridge power module.
Figure 13:
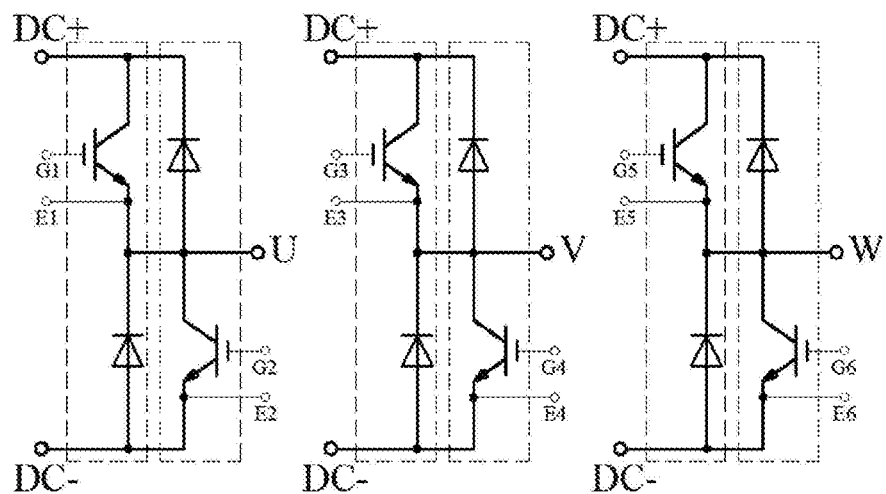
FIG. 13 is a topological diagram of the three-phase-bridge power module.

As shown in FIG. 12, the present invention may also be applied to a three-phase bridge structure. The three half-bridge power module structures described in the present invention are arranged in parallel and packaged in the same plastic package shell, so that a low parasitic inductance three-phase bridge power module can be realized, i.e., one power module includes three positive power terminals 1, three negative power terminals 2 and three output power terminals 3, and a topological structure of the power module is a three half-bridge structure, as shown in FIG. 13.

Embodiment 2

Figure 14:
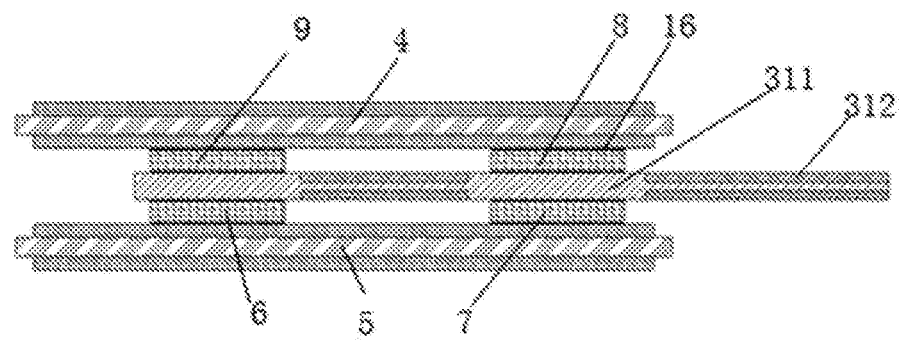
FIG. 14 is a structural schematic diagram of Embodiment 2.

As shown in FIG. 14, the structure of this embodiment is basically the same as that of Embodiment 1, but differs in that the welding portion of the output power terminal 3 in the embodiment is a matrix 311 at a position contacted with the chip, and is a three-layer structure at a position not contacted with the chip, the matrix 311 is located in a middle layer, and fillers 312 are located at upper and lower sides. The matrix 311 is metal molybdenum or tungsten copper with small thermal expansion coefficients, and the filler 312 is metal silver with good conductivity.

In this embodiment, the power chip is sintered on the molybdenum matrix 311 of the output electrode, and a groove is machined in a part of the output electrode that is not contacted with the chip, and the groove is filled with silver. The thermal expansion coefficient of the metal molybdenum is generally one third of that of copper, which is close to that of the chip. During the operation of the power module, the pad layer 16 has a relatively small thermal stress but a relatively higher reliability. However, the conductivity of molybdenum is only one third of that of copper. Therefore, a resistance of the output electrode can be reduced by filling a silver structure in a part of the output electrode.

Embodiment 3

Figure 15:
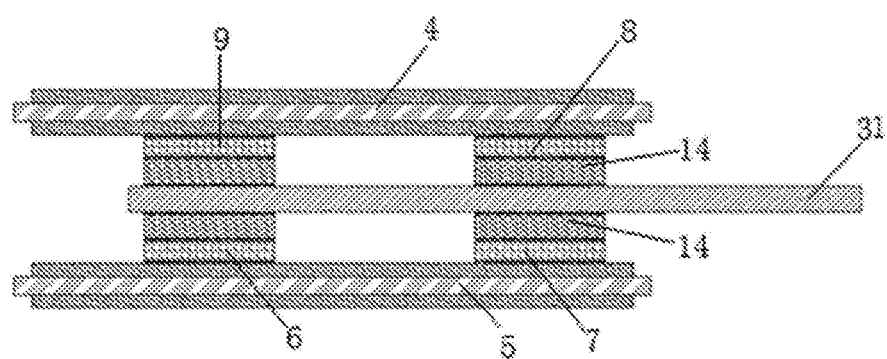
FIG. 15 is a structural schematic diagram of Embodiment 3.
Figure 16:
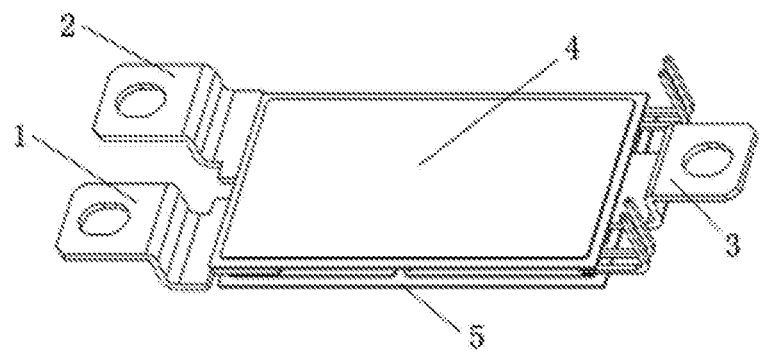
FIG. 16 is a schematic diagram illustrating an interior of Embodiment 4.

As shown in FIG. 15, the structure of this embodiment is basically the same as that of Embodiment 1, but differs in that a stress buffer layer 14 is filled between the welding portion 31 of the output power terminal 3 and the chip, the welding portion 31 of the output power terminal 3 is metallic copper, and the stress buffer layer 14 is metallic molybdenum or tungsten copper.

The output electrode is made of pure copper. Due to a larger difference in thermal expansion between the copper and the chip, in order to improve the long-term reliability of the pad layer 16, the stress buffer layer 14 is added between the chip and the output electrode for transition in this embodiment, i.e., metal molybdenum or tungsten copper is sintered on the surface of the chip, and then molybdenum or tungsten copper is sintered on the output electrode.

Embodiment 4

Figure 17:
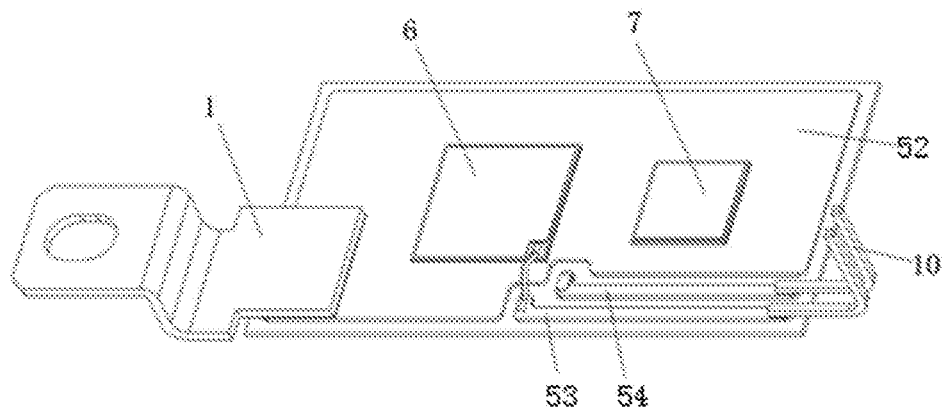
FIG. 17 is a schematic diagram illustrating components of a bottom metal insulating substrate of Embodiment 4.

As shown in FIGS. 16 to 19, the structure of this embodiment is basically the same as that of Embodiment 1, but differs in that, in FIG. 17, the bottom metal insulating substrate 5 is provided with a surface metal layer 52 of the bottom metal insulating substrate, a first local metal layer 53 and a second local metal layer 54, wherein the first local metal layer 53 and the second local metal layer 54 are respectively connected with an upper half bridge driving terminal 10, and the output power terminal 3 is electrically connected with the second local metal layer 54, thereby realizing control of the upper half bridge switch chip.

When the upper half-bridge switch chip 6 is an IGBT, the positive power terminal 1 is electrically connected with a collector electrode of the upper half-bridge switch chip 6 and a negative electrode of the upper half-bridge diode chip 7. When the upper half-bridge switch chip 6 is a MOSFET, a gate electrode of the upper half-bridge switch chip 6 is electrically connected with the first local metal layer 53 through a bonding wire.

When the upper half-bridge switch chip 6 is a MOSFET, the positive power terminal 1 is electrically connected with a drain electrode of the upper half-bridge switch chip 6 and the negative electrode of the upper half-bridge diode chip 7, and the gate electrode of the upper half-bridge switch chip 6 is electrically connected with the first local metal layer 53 through a bonding wire.

Figure 18:
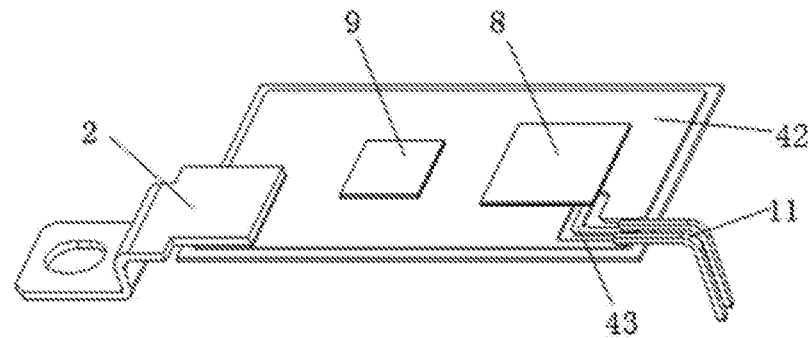
FIG. 18 is a schematic diagram illustrating components of a top metal insulating substrate of Embodiment 4.
Figure 19:
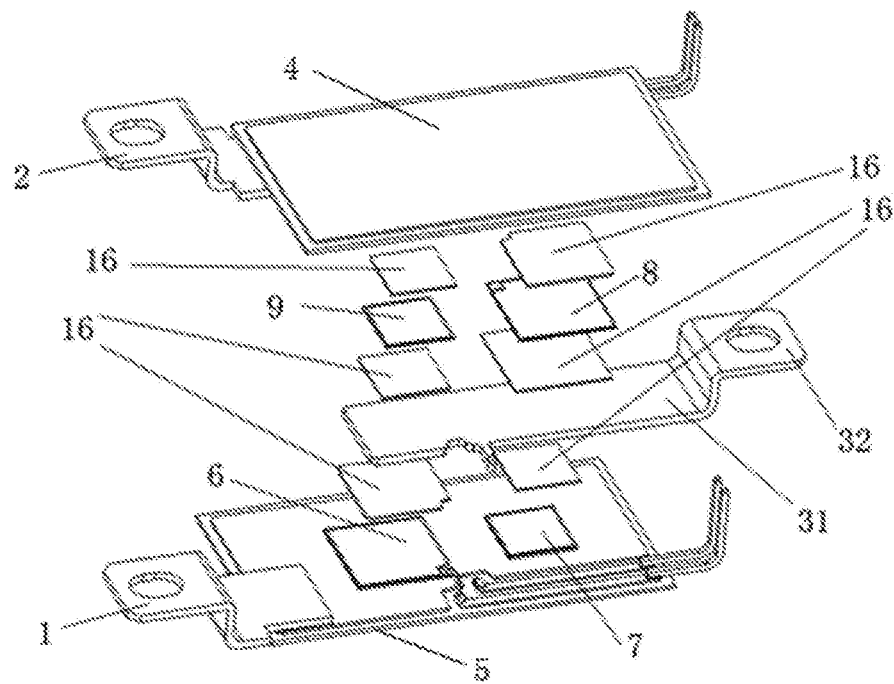
FIG. 19 is an explosion schematic diagram of Embodiment 4.

In FIG. 18, the top metal insulating substrate 4 is provided with a surface metal layer 42 of the top metal insulating substrate and a third local metal layer 43. The other end of the third local metal layer 43 is connected with a lower half-bridge driving terminal 11. The surface metal layer 42 of the top metal insulating substrate is also connected with a lower half-bridge driving terminal 11.

When the lower half-bridge switch chip 8 is an IGBT, the negative power terminal 2 is electrically connected with an emitter electrode of the lower half-bridge switch chip 8 and a positive electrode of the lower half-bridge diode chip 9, and a gate electrode of the lower half-bridge switch chip 8 is connected with the third local metal layer 43.

When the lower half-bridge switch chip 8 is a MOSFET, the negative power terminal 2 is electrically connected with a source electrode of the lower half-bridge switch chip 8 and the positive electrode of the lower half-bridge diode chip 9, and the gate electrode of the lower half-bridge switch chip 8 is connected with the third local metal layer 43.

As a basis for forming a semiconductor chip, a silicon substrate may be used in the present invention, and a germanium substrate or an III-V semiconductor material such as GaN or SiC may also be used. In addition, plastic materials or ceramic materials and the like may be used for packaging, molding or encapsulating.

Embodiment 5

The structure of this embodiment is basically the same as that of Embodiment 1, but differs in that:

the positive power terminal 1 and the negative power terminal 2 are both sintered on the top metal insulating substrate 4, and at least one input power terminal is connected with the bottom metal insulating substrate 5 through a metal joint pin;

or, the positive power terminal 1 and the negative power terminal 2 are both sintered on the bottom metal insulating substrate 5, and are connected with the top metal insulating substrate 4 through a metal joint pin;

or, the positive power terminal 1 and the negative power terminal 2 are sintered together with the top metal insulating substrate 4 and the bottom metal insulating substrate 5.

The plastic package shell 15 is provided with heat radiators on both sides of the back metal layer 41 of the top metal insulating substrate and the back metal layer 51 of the bottom metal insulating substrate.

Figure 20:
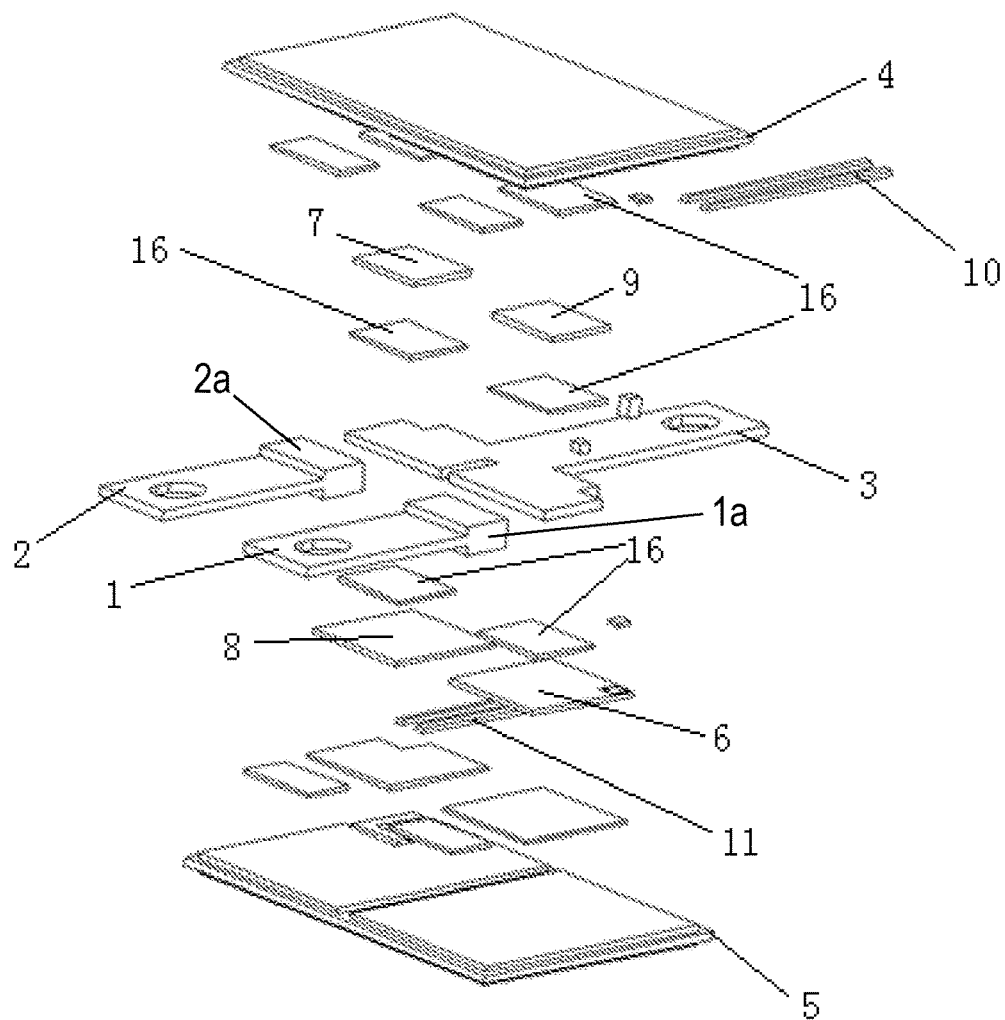
FIG. 20 is an explosion schematic diagram of Embodiment 5.

As shown in FIG. 20, the chips sintered on the top metal insulating substrate 4 are a lower half-bridge diode chip 9 and an upper half-bridge diode chip 7, the chips sintered on the bottom metal insulating substrate 5 are a lower half-bridge switch chip 8 and an upper half-bridge switch chip 6, wherein the lower half-bridge diode chip 9 and the lower half-bridge switch chip 8 are stacked, and the upper half-bridge diode chip 7 and the upper half-bridge switch chip 6 are stacked.

Figure 21:
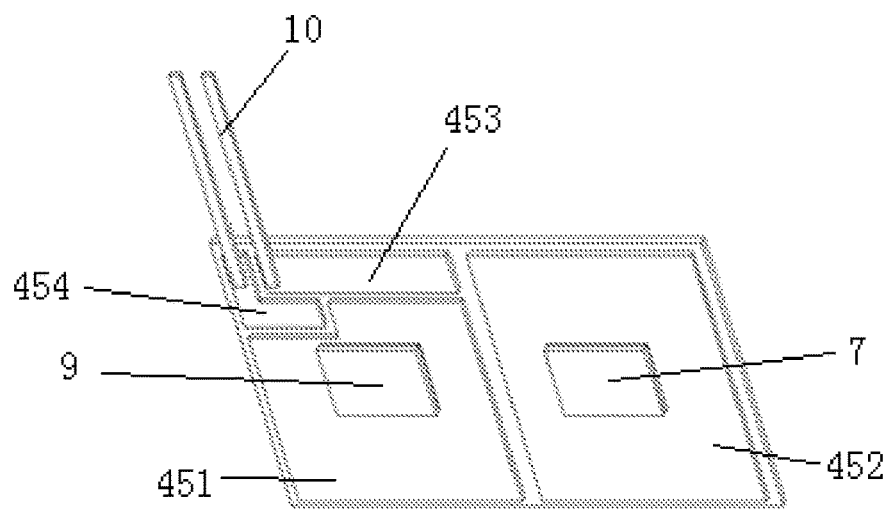
FIG. 21 is a schematic structure diagram of a top metal insulating substrate of Embodiment 5.

As shown in FIG. 21, the top metal insulating substrate 4 includes a positive metal layer 451 of the top metal insulating substrate electrically connected with the positive power terminal 1 through sintering, a negative metal layer 452 of the top metal insulating substrate electrically connected with the negative power terminal 2 through sintering, an emitting/source electrode local metal layer 453 of the upper half-bridge switch chip 6 electrically connected with the output power terminal 3 and one upper half-bridge driving terminal, and a gate electrode local metal layer 454 of the upper half-bridge switch chip 6 electrically connected with another upper half-bridge driving terminal.

A surface of the positive metal layer 451 of the top metal insulating substrate is sintered with the upper half-bridge diode chip 7 and is opposite to the negative electrode of the upper half-bridge diode chip 7. A surface of the negative metal layer 452 of the top metal insulating substrate is sintered with the lower half-bridge diode chip 9 and is opposite to the positive electrode of the lower half-bridge diode chip 9. The gate electrode local metal layer 454 of the upper half-bridge switch chip 6 is electrically connected with the gate electrode of the upper half-bridge switch chip 6.

Figure 22:
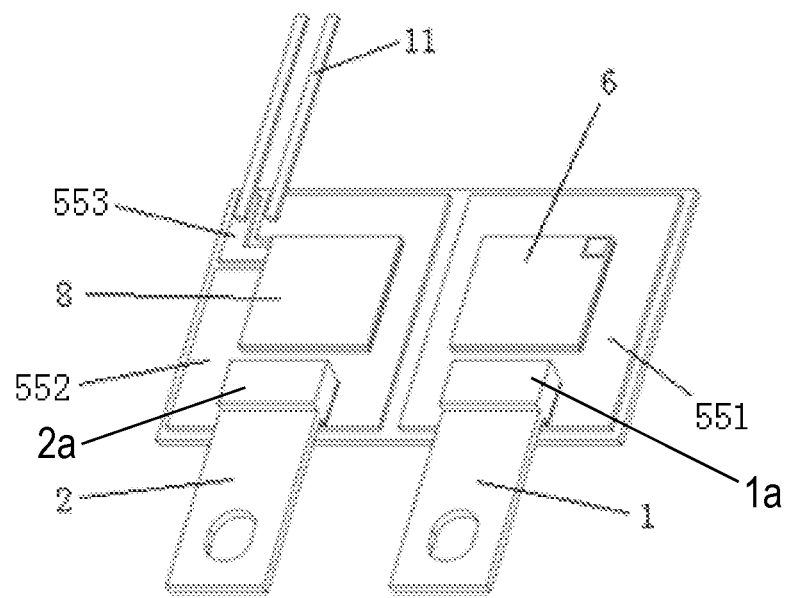
FIG. 22 is a schematic structure diagram of a bottom metal insulating substrate of Embodiment 5.

As shown in FIG. 22, the bottom metal insulating substrate 5 includes a positive metal layer 551 of the bottom metal insulating substrate electrically connected with the positive power terminal 1 through sintering, a negative metal layer 552 of the bottom metal insulating substrate electrically connected with the negative power terminal 2 and one lower half-bridge driving terminal, and a gate electrode local metal layer 553 of the lower half-bridge switch chip electrically connected with another lower half-bridge driving terminal. Both the positive power terminal 1 and the negative power terminal 2 can be connected to the positive metal layer 551 of the bottom metal insulating substrate and the negative metal layer 552 of the bottom metal insulating substrate by sintering or ultrasonic metal welding respectively.

A surface of the positive metal layer 451 of the bottom metal insulating substrate is sintered with the upper half-bridge switch chip 6 and is opposite to the collector electrode or the drain electrode of the upper half-bridge switch chip 6. A surface of the negative metal layer 552 of the bottom metal insulating substrate is sintered with the lower half-bridge switch chip 8 and is opposite to the emitter electrode of the lower half-bridge switch chip 8. The gate electrode local metal layer 553 of the lower half-bridge switch chip is electrically connected with the gate electrode of the lower half-bridge switch chip 8 through sintering.

Figure 23:
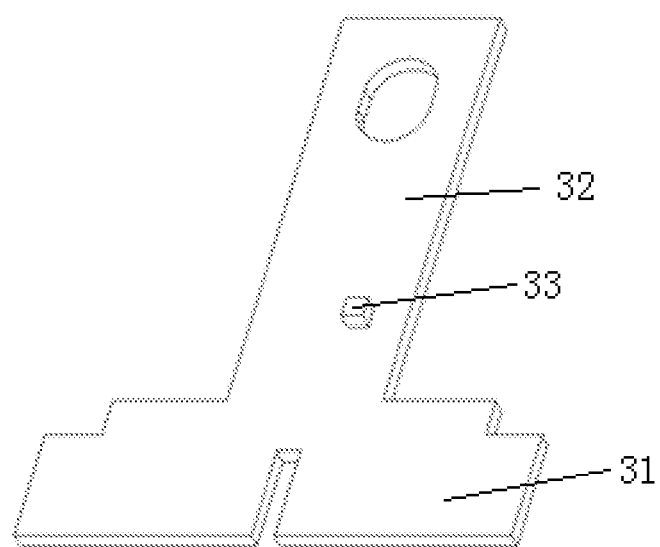
FIG. 23 is a schematic structure diagram of an output power terminal of Embodiment 5.

As shown in FIG. 23, the output power terminal 3 includes a connecting portion 32 provided with a connection hole, a welding portion 31 for connecting with the chip, and an upper half-bridge leading-out terminal 33. The welding portion 31 is sintered with the emitter electrode or the source electrode of the upper half-bridge switch chip 6; wherein, when the upper half-bridge switch chip 6 is an IGBT, the welding portion 31 is sintered with the emitter electrode of the upper half-bridge switch chip 6; and when the upper half-bridge switch chip 6 is a MOSFET, the welding portion 31 is sintered with the source electrode of the upper half-bridge switch chip 6. The welding portion 31 is sintered with the collector electrode or the drain electrode of the lower half-bridge switch chip 8; wherein, when the lower half-bridge switch chip 8 is an IGBT, the welding portion 31 is sintered with the collector electrode of the lower half-bridge switch chip 8; and when the lower half-bridge switch chip 8 is a MOSFET, the welding portion 31 is sintered with the drain electrode of the lower half-bridge switch chip 8. The welding portion 31 is sintered with the positive electrode of the upper half-bridge diode chip 7, and is sintered with the negative electrode of the lower half-bridge diode chip 9. A metal stress buffer layer is arranged between the welding portion 31 and the chip, and the welding portion 31 and the chip are connected through the metal stress buffer layer.

Embodiment 6

Figure 24:
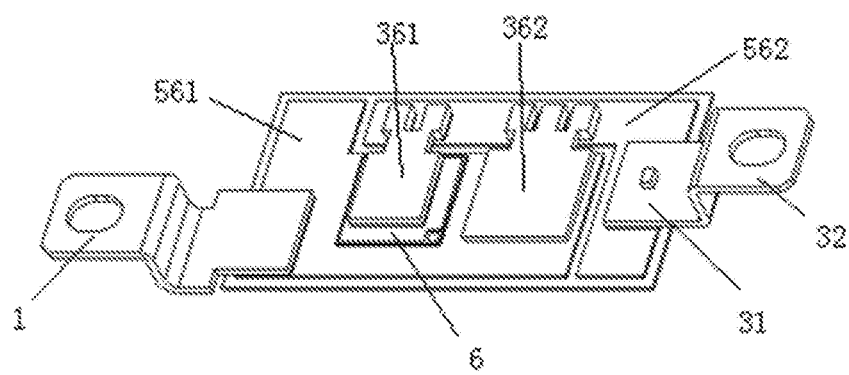
FIG. 24 is a schematic diagram illustrating components of a bottom metal insulating substrate of Embodiment 6.

The structure of this embodiment is basically the same as that of Embodiment 1, but differs in that:

As shown in FIG. 24, the bottom metal insulating substrate 5 is provided with an upper half-bridge surface metal layer 561 and an output local metal layer 562. The upper half-bridge surface metal layer 561 is sintered with the upper half-bridge switch chip 6 and the upper half-bridge diode chip 7.

Figure 25:
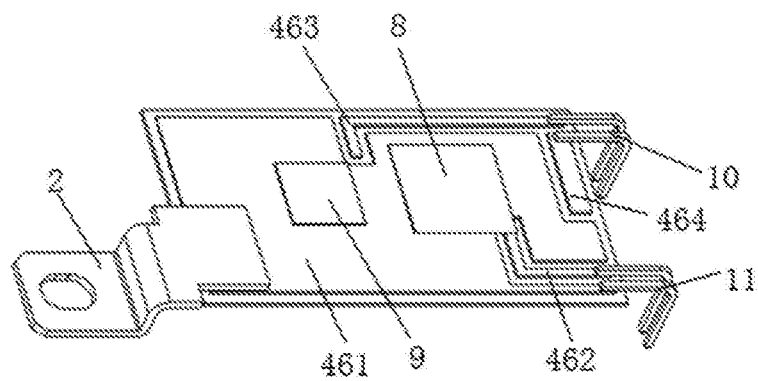
FIG. 25 is a schematic diagram illustrating components of a top metal insulating substrate of Embodiment 6.

As shown in FIG. 25, the top metal insulating substrate 4 is provided with a lower half-bridge surface metal layer 461, a lower half-bridge driving local metal layer 462, a first upper half-bridge driving local metal layer 463 and a second upper half-bridge driving local metal layer 464. The lower half-bridge switch chip 8 and the lower half-bridge diode chip 9 are sintered on the lower half-bridge surface metal layer 461. The lower half-bridge surface metal layer 461 and the lower half-bridge driving local metal layer 462 are respectively connected with a lower half-bridge driving terminal. The first upper half-bridge driving local metal layer 463 and the second upper half-bridge driving local metal layer 464 are respectively connected with an upper half-bridge driving terminal.

When the lower half-bridge switch chip 8 is an IGBT, the lower half-bridge surface metal layer 461 is connected with an emitter electrode of the IGBT chip. When the lower half-bridge switch chip 8 is a MOSFET, the lower half-bridge surface metal layer 461 is connected with a source electrode of the MOSFET chip, the lower half-bridge driving local metal layer 462 is connected with a gate electrode of the lower half-bridge switch chip 8, the first upper half-bridge driving local metal layer 463 is connected with a gate electrode of the upper half-bridge switch chip 6, and the second upper half-bridge driving local metal layer 464 is connected with the welding portion 31 of the output power terminal 3.

Figure 26:
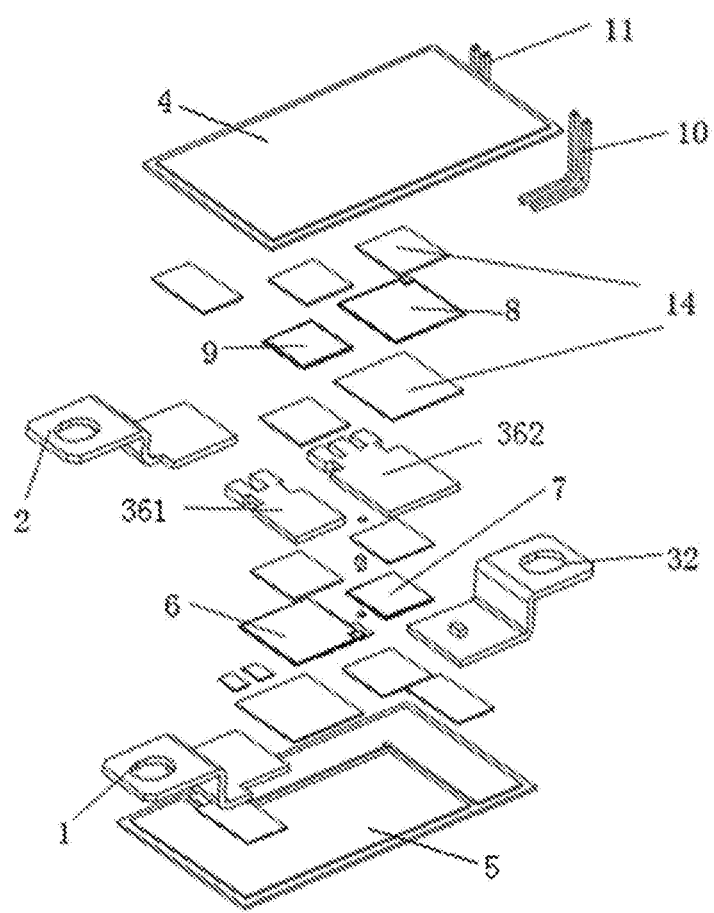
FIG. 26 is an explosion schematic diagram of Embodiment 6.

As shown in FIG. 24, FIG. 25 and FIG. 26, the output power terminal 3 includes a welding portion 31 and a connecting portion 32 provided with a mounting hole. The welding portion 31 is located between the bottom metal insulating substrate 5 and the top metal insulating substrate 4. The bottom metal insulating substrate 5 or the top metal insulating substrate 4 is provided with an output local metal layer 562. The output power terminal 3 is connected with a chip connecting block through the output local metal layer 562. The chip connecting block is electrically connected with the chip on the bottom metal insulating substrate 5 and the chip on the top metal insulating substrate 4. The welding portion 31 in this embodiment is of a planar structure. One end of the welding portion 31 is bent and extends upwardly to form the connecting portion 32 having a mounting hole. During specific application, the welding portion 31 may be made into a whole slabbed structure without bending according to actual needs.

The welding portion 31 is provided with an upper half-bridge driving connecting terminal, the upper half-bridge driving connecting terminal is connected with the second upper half-bridge driving local metal layer of the top metal insulating substrate 4, and the other end of the second upper half-bridge driving local metal layer 464 is connected with an upper half-bridge driving terminal. In this embodiment, the upper half-bridge driving connecting terminal may adopt a separate metal connecting block or may be integrated with the output power terminal 3. The gate electrode of the upper half-bridge switch chip 6 and the first upper half-bridge driving local metal layer 463 of the top metal insulating substrate 4 are electrically connected by using the metal connecting block, and the metal connecting block is made of conductive materials. The chip connecting block may be made of metal materials such as molybdenum, tungsten copper and the like which are relatively matched with the thermal expansion coefficients of the chip, and the thermal expansion coefficient of the chip connecting block is preferably in the range of 2 ppm/° C. to 8 ppm/° C. In this way, a thermal stress of a sintered layer between the chip and the chip connecting block can be reduced, premature cracking failure of the sintered layer can be avoided, and the reliability is improved. Moreover, the first upper half-bridge driving local metal layer 463 may also be arranged on the bottom metal insulating substrate 5. At this time, the gate electrode of the upper half-bridge switch chip 6 and the first upper half-bridge driving local metal layer 463 may be connected by a bonding wire.

The chip connecting block may be a whole or may be split according to the number of chips. In this embodiment, the chip connecting block is divided into a first chip connecting block 361 and a second chip connecting block 362. Both the first chip connecting block 361 and the second chip connecting block 362 are sintered with the output local metal layer 562. The first chip connecting block 361 is sintered with the lower half-bridge diode chip 9 on one face facing the top metal insulating substrate 4, and is sintered with the upper half-bridge switch chip 6 on one face facing the bottom metal insulating substrate 5. The second chip connecting block 362 is sintered with the lower half-bridge switch chip 8 on one face facing the top metal insulating substrate 4, and is sintered with the upper half-bridge diode chip 7 7 on one face facing the bottom metal insulating substrate 5.

Embodiment 7

Figure 27:
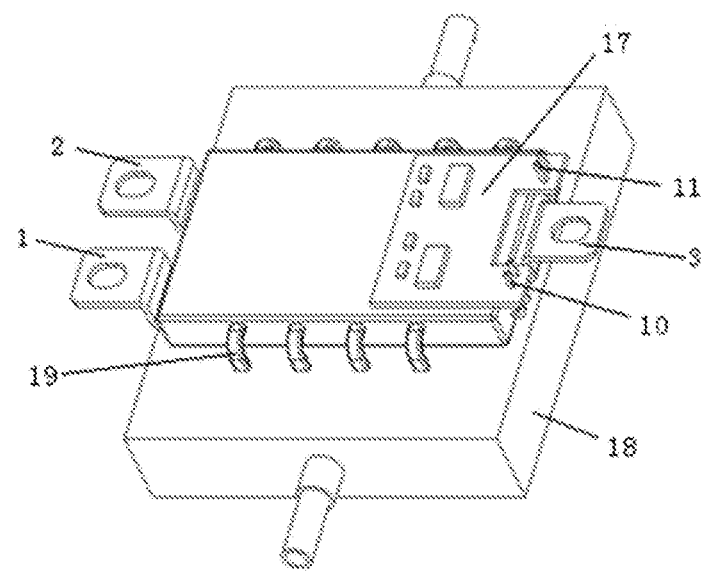
FIG. 27 is a structural schematic diagram of Embodiment 7.

The structure of this embodiment is basically the same as that of Embodiments 1 to 6, but differs in that, as shown in FIG. 27, this embodiment is provided with a heat radiator 18 on the lower surface of the power module and provided with a plurality of heat pipes 19 on the upper surface of the power module according to Embodiments 1 to 6.

Figure 28:
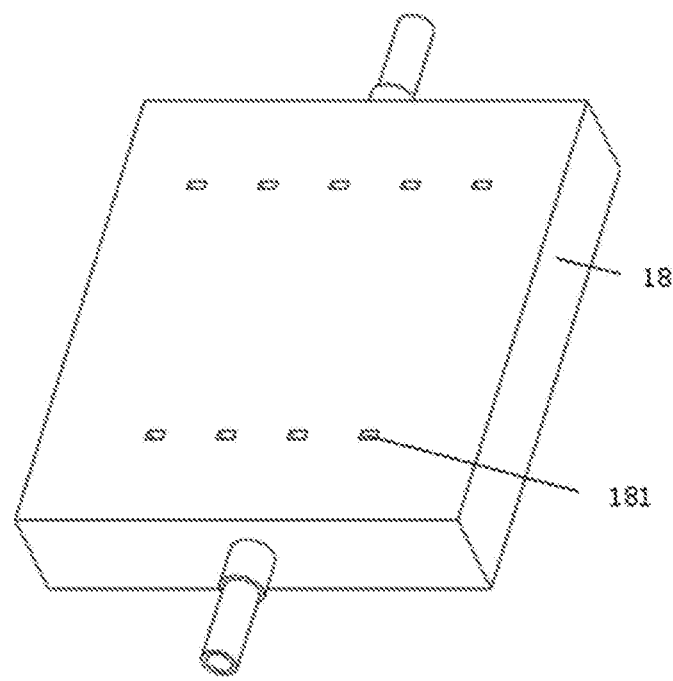
FIG. 28 is a schematic diagram of a heat radiator of Embodiment 7.

As shown in FIG. 28, the heat radiator 18 is provided with a heat pipe insertion opening 181. The heat pipe 19 includes an evaporation section 191, and a beginning end of the evaporation section 191 is connected to the power module. In this embodiment, a plurality of evaporation sections 191 are staggered on the upper surface of the power module. The evaporation section 191 is bent downwards at an edge of the power module to form a connecting section 192. The connection section 192 is inserted into the heat pipe insertion opening port 181 of the heat radiator 18 and fixed. In this embodiment, the connecting section 192 includes a condensation section extending therefrom, and the condensation section is inserted into the heat pipe insertion opening 181 of the heat radiator 18 and fixed. The plurality of evaporation sections 191 may also adopt a parallel but non-staggered manner, i.e., the beginning end is not connected to the power module, a main body of the evaporation section 191 is sintered on the upper surface of the power module, both ends of the heat pipe 19 are bent downwards at the edge of the power module to form the connecting section 192, and the connecting section 192 is inserted into the heat pipe insertion opening 181 of the heat radiator 18 and fixed.

The heat radiator 18 and a cold end of the heat pipe 19 may be connected by soft soldering, or by other media, or by interference fit. The cold end of the heat pipe 19 can be directly contacted with a liquid heat dissipation medium. At this time, the connecting hole between the heat radiator and the heat pipe 19 needs to be sealed.

Figure 29:
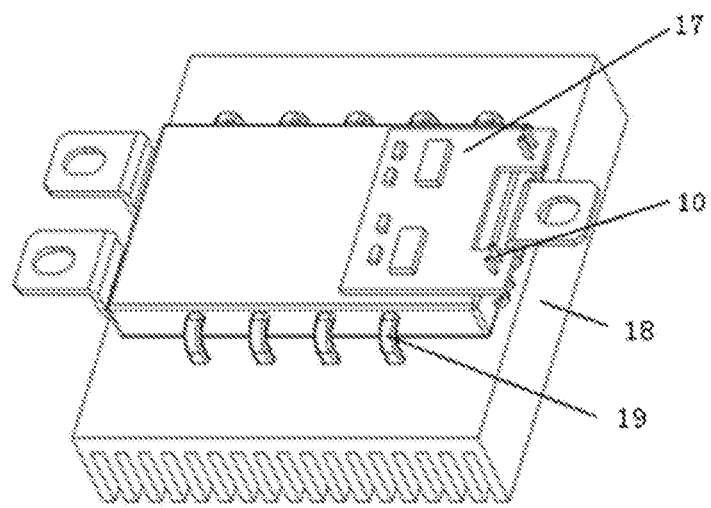
FIG. 29 is a schematic diagram illustrating a heat dissipation manner of Embodiment 7.

As shown in FIG. 29, the heat radiator 18 may adopt water cooling, air cooling or other heat dissipation methods commonly used in this field. In this embodiment, the heat radiator 18 is an air cooling heat radiator, and the cold end of the heat pipe 19 is inserted into the air cooling heat radiator.

Figure 30:
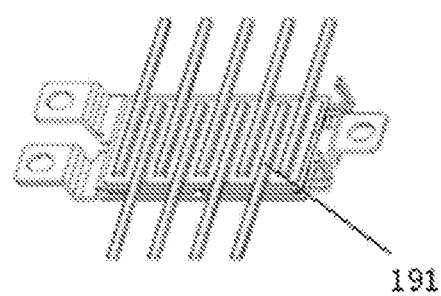
FIGS. 30, 31 and 32 are schematic diagrams illustrating assembly processes of Embodiment 7.
Figure 31:
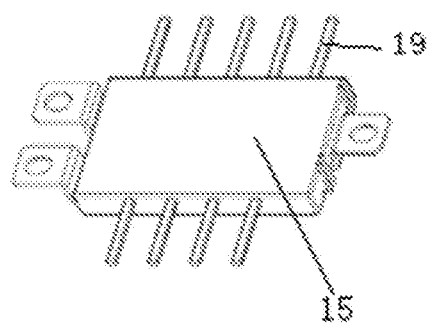
Figure 32:
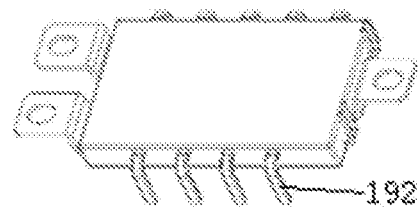

FIGS. 30 to 32 show an assembly process of the power module and the heat pipe 19 in this embodiment, wherein one end of the heat pipe 19 is soldered to an outer surface of the top metal insulating substrate 4 in the power module by soft soldering; then, injection molding is performed on the module, and the heat pipe 19 outside the module finishing the injection molding is bent towards a direction of the bottom metal insulating substrate 5. In this embodiment, the evaporation section 191 of the heat pipe 19 is wrapped in the plastic package shell 15. At this time, in order to facilitate contact and heat dissipation with the heat radiator at the bottom of the power module, a middle part of a lower surface of the bottom metal insulating substrate 5 is exposed from the plastic package shell 15, and is not necessary to be enveloped in the plastic package shell 15 together with the upper surface of the top metal insulating substrate 4 contacted with the heat radiator and the evaporation section 191 of the heat pipe.

At this time, heat of the power chip is conducted to the evaporation section 191 of the heat pipe 19 through the top metal insulating substrate 4. A filling medium in the heat pipe 19 changes from a liquid phase to a vapor phase. After reaching the cold end of the heat pipe 19, the heat dissipation medium in a vapor phase changes into a liquid phase again, and reaches the evaporation section 191 under the action of capillary siphon. The heat at the top of the module is continuously circulated to realize the purpose of conducting the heat to the cold end. In order to reduce the thermal resistance between the evaporation section 191 of the heat pipe 19 and the top metal insulating substrate 4, the evaporation section 191 is soldered to the top metal of the power module by soft soldering. To further optimize the heat dissipation effect, the arrangements of the heat pipes 19 are divided into staggered and bidirectional arrangements.

Some elements on a driving board 17 of the power module will also generate a large amount of heat during operation. If the heat is not dissipated in time, there is also a risk that the elements will burn out. According to the power module of the present invention, since the heat pipe 19 with high heat conductivity is arranged on the top metal insulating substrate 4, the driving board 17 can be contacted with the heat pipe 19 through the heat dissipation medium, and heat of the driving board 17 can also be conducted to the heat radiator through the heat pipe 19 at this time, thus further improving a system reliability.

Embodiment 8

Figure 33:
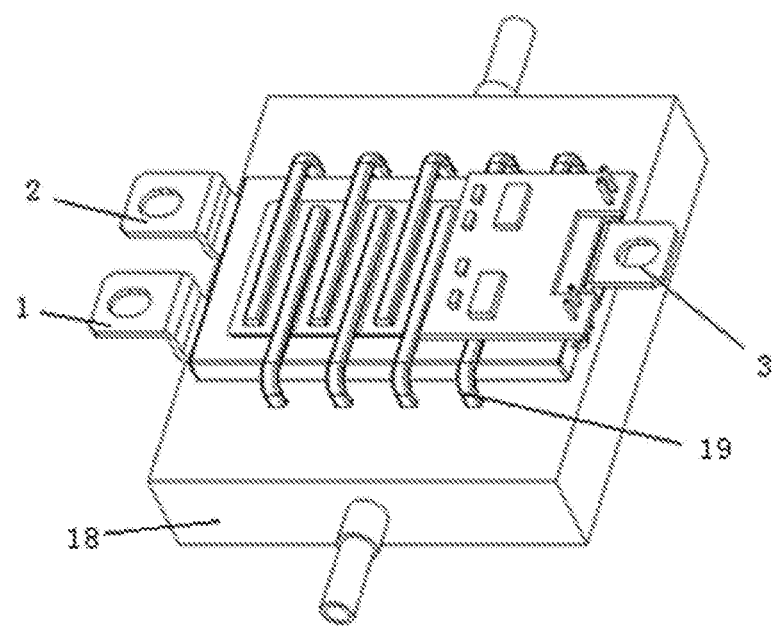
FIG. 33 is a structural schematic diagram of Embodiment 8.

The structure of this embodiment is basically the same as that of Embodiment 7, but differs in that:

as shown in FIG. 33, the heat pipes 19 in staggered arrangement are sintered on the upper surface of the top metal insulating substrate 4, and the cold ends of the heat pipes 19 are bent towards the direction of the bottom metal insulating substrate 5 and inserted into the heat radiator 18. The driving board 17 is connected with the driving terminal and fixed on the other surface of the heat pipe 19 through an adhesive material with high thermal conductivity to achieve the purpose of driving the chip to dissipate heat. At this time, the middle part of the upper surface of the top metal insulating substrate 4 and the middle part of the lower surface of the bottom metal insulating substrate 5 are exposed from the plastic package shell 15, and both the middle part of the upper surface of the top metal insulating substrate 4 and the middle part of the lower surface of the bottom metal insulating substrate 5 are both higher than the plastic package shell 15 to facilitate contact with the heat radiator. The evaporation section 191 of the heat pipe 19 is sintered on the top metal insulating substrate 4, and the evaporation section 191 is exposed outside the plastic package shell 15.

Embodiment 9

Figure 34:
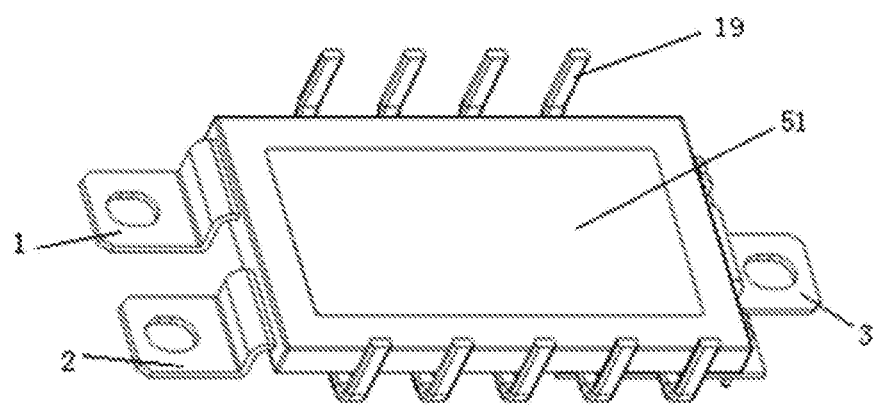
FIG. 34 is a schematic diagram illustrating a back side of a power module of Embodiment 9.
Figure 35:
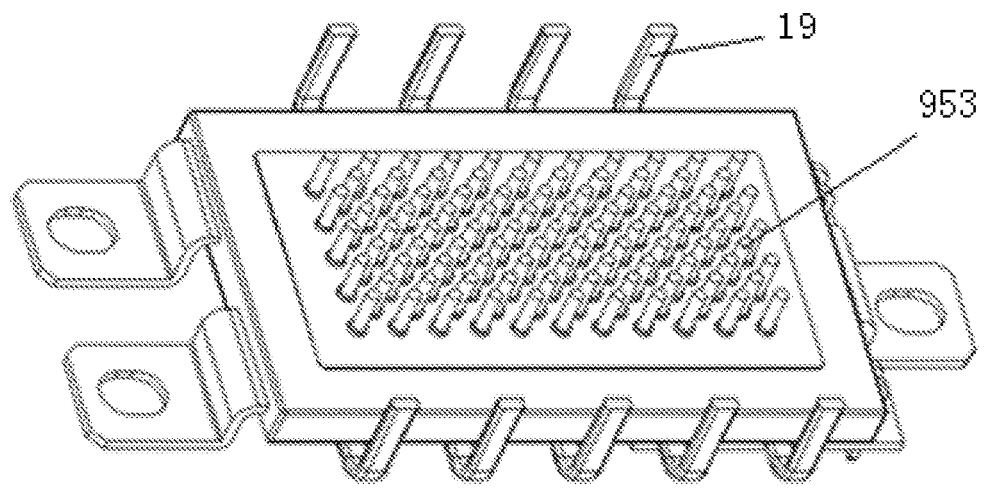
FIG. 35 is schematic diagram illustrating the back side of Embodiment 9 provided with a turbulence structure.
Figure 36:
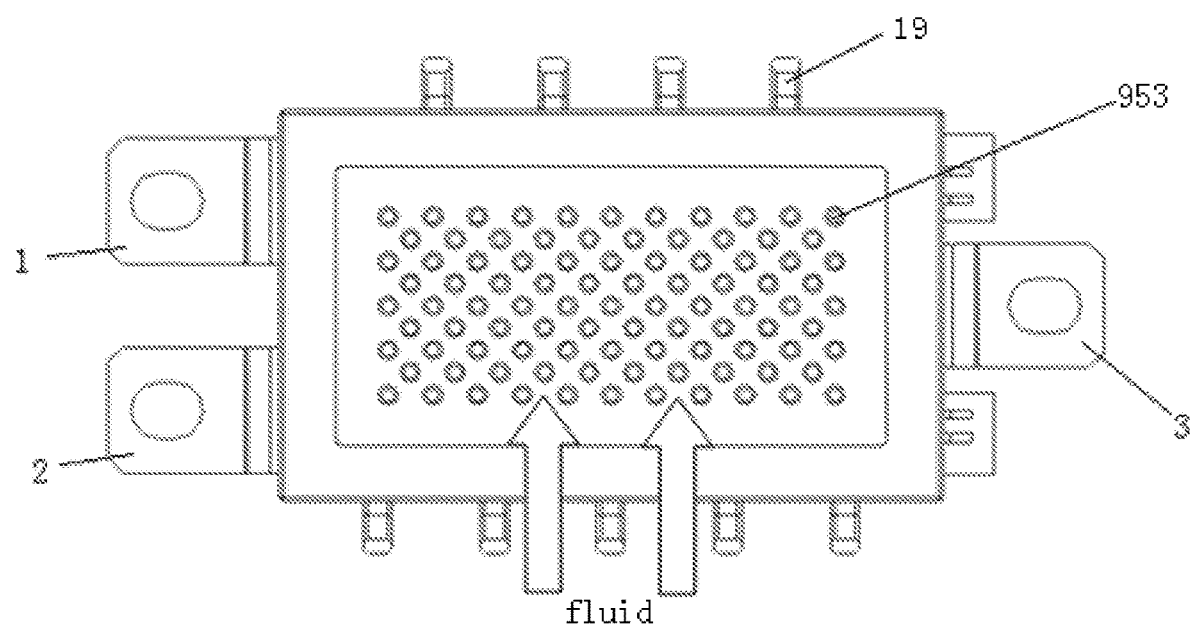
FIG. 36 is a schematic diagram illustrating a fluid direction of Embodiment 9.

The structure of this embodiment is basically the same as that of Embodiment 7 and Embodiment 8, but differs in that:

as shown in FIGS. 34 to 36, in this embodiment, a turbulence structure 953 is sintered in the middle part of the lower surface of the bottom metal insulating substrate 5, and a fluid is directly contacted with the turbulence structure 953 to achieve a better heat dissipation effect. The turbulence structure 953 in this embodiment is a staggered cylindrical pin-fin, which is sintered on the lower surface of the bottom metal insulating substrate 5 by solders, and the pin-fins in a direction that the fluid flows to are arranged in a staggered manner, thus increasing the turbulence of the fluid and enhancing the heat exchange effect between the fluid and the pin-fin.

Figure 37:
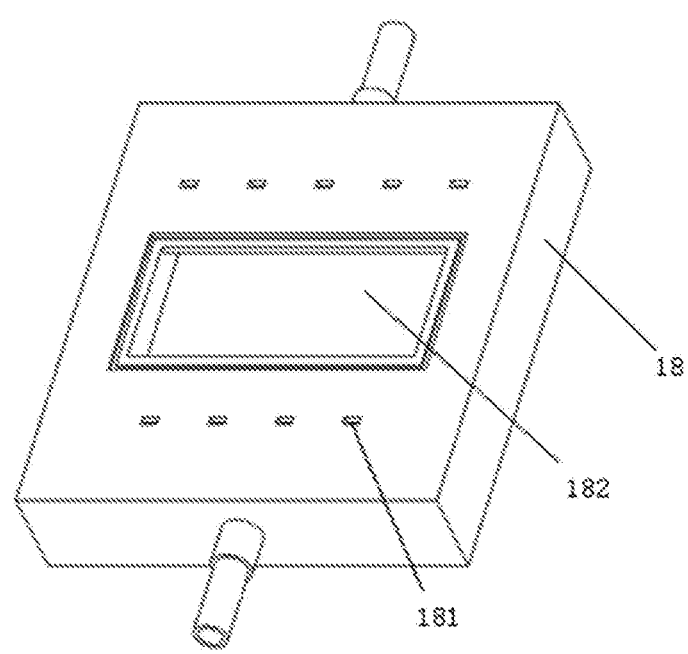
FIG. 37 is a schematic diagram of a heat radiator of Embodiment 9.

As shown in FIG. 37, an upper surface of the heat radiator 18 is provided with a turbulence hole 182, the turbulence structure 953 extends into the heat radiator 18 through the turbulence hole 182 and is sealed at an opening of the turbulence hole 182, to form a heat exchange channel for heat dissipation media in the heat radiator.

The turbulence structure 953 is not limited to the cylindrical pin-fin, and a cross section thereof may also be rhombus, square, rib-like structure, etc. The pin-fin is generally made of copper and plated with other metals on a surface thereof. By printing solder paste on the lower surface of the bottom metal insulating substrate 5 and using a tooling fixture, the pin-fin is sintered on the lower surface of the bottom metal insulating substrate 5. Heat generated in the power module is conducted to the pin-fin through the bottom metal insulating substrate 5, while the pin-fin is directly contacted with the fluid, thus removing the heat conductive silicone grease of the slabbed structure of the metal layer on the lower surface of the bottom metal insulating substrate 5, increasing a heat dissipation area of the power module and reducing the thermal resistance of the power module.

The descriptions above are merely preferable embodiments of the invention, and it should be noted that those of ordinary skills in the art may make a plurality of improvements and decorations without departing from the principle of the invention, and these improvements and decorations shall also fall within the protection scope of the invention.

What is claimed is:

1. A low parasitic inductance power module, comprising an input power terminal, an output power terminal, a top metal insulating substrate, a bottom metal insulating substrate and a plastic package shell, wherein the input power terminal comprises a positive power terminal and a negative power terminal, the top metal insulating substrate and the bottom metal insulating substrate are stacked, chips are sintered on faces of both the top metal insulating substrate and the bottom metal insulating substrate opposite to each other, and the positive power terminal, the negative power terminal, and the output power terminal are all electrically connected with the chips; and the output power terminal comprises a welding portion and a connecting portion located outside the plastic package shell, and the welding portion is located between the top metal insulating substrate and the bottom metal insulating substrate, wherein the welding portion of the output power terminal is a matrix at a position contacted with the chip, and is a three-layer structure at a position not contacted with the chip, the matrix is located in the middle layer, and fillers are located at upper and lower sides.

2. The low parasitic inductance power module according to claim 1, wherein an upper half-bridge switch chip and an upper half-bridge diode chip are sintered on the bottom metal insulating substrate, and a lower half-bridge switch chip and a lower half-bridge diode chip are sintered on the top metal insulating substrate; and the upper half-bridge switch chip and the lower half-bridge diode chip are stacked, and the lower half-bridge switch chip and the upper half-bridge diode chip are stacked.

3. The low parasitic inductance power module according to claim 2, wherein the positive power terminal is sintered on the bottom metal insulating substrate, and the negative power terminal is sintered on the top metal insulating substrate; and the welding portion is located between the chip sintered on the top metal insulating substrate and the chip sintered on the bottom metal insulating substrate.

4. The low parasitic inductance power module according to claim 2, wherein the positive power terminal is sintered on the bottom metal insulating substrate, the negative power terminal is sintered on the top metal insulating substrate, the bottom metal insulating substrate or the top metal insulating substrate is provided with an output local metal layer, the output power terminal is connected with a chip connecting block through the output local metal layer, and the chip connecting block is electrically connected with the chip on the bottom metal insulating substrate and the chip on the top metal insulating substrate.

5. The low parasitic inductance power module according to claim 1, wherein the chips sintered on the top metal insulating substrate are a lower half-bridge diode chip and an upper half-bridge diode chip, the chips sintered on the bottom metal insulating substrate are a lower half-bridge switch chip and an upper half-bridge switch chip, the lower half-bridge diode chip and the upper half-bridge switch chip are stacked, and the upper half-bridge diode chip and the lower half-bridge switch chip are stacked.

6. The low parasitic inductance power module according to claim 2, wherein the positive power terminal and the negative power terminal are both sintered on the top metal insulating substrate, and at least one input power terminal is connected with the bottom metal insulating substrate through a metal joint pin; or, the positive power terminal and the negative power terminal are both sintered on the bottom metal insulating substrate, and are connected with the top metal insulating substrate through a metal joint pin; or, the positive power terminal and the negative power terminal are sintered together with the top metal insulating substrate and the bottom metal insulating substrate; and the welding portion is located between the chip sintered on the top metal insulating substrate and the chip sintered on the bottom metal insulating substrate.

7. The low parasitic inductance power module according to claim 3, wherein the welding portion is sintered with the upper half-bridge switch chip and the upper half-bridge diode chip on one face facing the bottom metal insulating substrate, and is sintered with the lower half-bridge switch chip and the lower half-bridge diode chip on one face facing the top metal insulating substrate.

8. The low parasitic inductance power module according to claim 3, wherein the bottom metal insulating substrate is provided with a surface metal layer of the bottom metal insulating substrate, the upper half-bridge switch chip and the upper half-bridge diode chip are sintered on the surface metal layer of the bottom metal insulating substrate, when the upper half-bridge switch chip is an IGBT, the positive power terminal is electrically connected with a collector electrode of the upper half-bridge switch chip and a negative electrode of the upper half-bridge diode chip, and when the upper half-bridge switch chip is a MOSFET, the positive power terminal is electrically connected with a drain electrode of the upper half-bridge switch chip and the negative electrode of the upper half-bridge diode chip;

the top metal insulating substrate is provided with a surface metal layer of the top metal insulating substrate, a first upper half-bridge driving local metal layer and a second upper half-bridge driving local metal layer, the lower half-bridge switch chip and the lower half-bridge diode chip are sintered on the surface metal layer of the top metal insulating substrate, the first upper half-bridge driving local metal layer and the second upper half-bridge driving local metal layer are respectively connected with an upper half-bridge driving terminal, a gate electrode of the upper half-bridge switch chip is electrically connected with the first upper half-bridge driving local metal layer, and the output power terminal is electrically connected with the second upper half-bridge driving local metal layer; and the top metal insulating substrate is further provided with a lower half-bridge driving local metal layer, the lower half-bridge driving local metal layer is connected with a gate electrode of the lower half-bridge switch chip, the other end of the lower half-bridge driving local metal layer is connected with a lower half-bridge driving terminal, and the surface metal layer of the top metal insulating substrate is also connected with a lower half-bridge driving terminal.

9. The low parasitic inductance power module according to claim 4, wherein the chip connecting block is sintered with the upper half-bridge switch chip and the upper half-bridge diode chip on one face facing the bottom metal insulating substrate, and is sintered with the lower half-bridge switch chip and the lower half-bridge diode chip on one face facing the top metal insulating substrate.

10. The low parasitic inductance power module according to claim 4, wherein the chip connecting block is divided into a first chip connecting block and a second chip connecting block, and both the first chip connecting block and the second chip connecting block are sintered with the output local metal layer; the first chip connecting block is sintered with the lower half-bridge diode chip on one face facing the top metal insulating substrate, and is sintered with the upper half-bridge switch chip on one face facing the bottom metal insulating substrate; and the second chip connecting block is sintered with the lower half-bridge switch chip on one face facing the top metal insulating substrate, and is sintered with the upper half-bridge diode chip on one face facing the bottom metal insulating substrate.

11. The low parasitic inductance power module according to claim 4, wherein the bottom metal insulating substrate is provided with an upper half-bridge surface metal layer and the output local metal layer, the upper half-bridge switch chip and the upper half-bridge diode chip are sintered on the upper half-bridge surface metal layer, when the upper half-bridge switch chip is an IGBT, the positive power terminal is electrically connected with a collector electrode of the upper half-bridge switch chip and a negative electrode of the upper half-bridge diode chip, and when the upper half-bridge switch chip is a MOSFET, the positive power terminal is electrically connected with a drain electrode of the upper half-bridge switch chip and a negative electrode of the upper half-bridge diode chip;

the top metal insulating substrate is provided with a lower half-bridge surface metal layer, a lower half-bridge driving local metal layer, a first upper half-bridge driving local metal layer and a second upper half-bridge driving local metal layer, the lower half-bridge switch chip and the lower half-bridge diode chip are sintered on the lower half-bridge surface metal layer, the lower half-bridge surface metal layer and the lower half-bridge driving local metal layer are respectively connected with a lower half-bridge driving terminal, and the first upper half-bridge driving local metal layer and the second upper half-bridge driving local metal layer are respectively connected with an upper half-bridge driving terminal; and when the lower half-bridge switch chip is an IGBT, the lower half-bridge surface metal layer is connected with an emitter electrode of the IGBT chip; and when the lower half-bridge switch chip is a MOSFET, the lower half-bridge surface metal layer is connected with a source electrode of the MOSFET chip, the lower half-bridge driving local metal layer is connected with a gate electrode of the lower half-bridge switch chip, the first upper half-bridge driving local metal layer is connected with a gate electrode of the upper half-bridge switch chip, and the second upper half-bridge driving local metal layer is connected with the welding portion of the output power terminal.

12. The low parasitic inductance power module according to claim 6, wherein the top metal insulating substrate comprises a positive metal layer of the top metal insulating substrate electrically connected with the positive power terminal, a negative metal layer of the top metal insulating substrate electrically connected with the negative power terminal, an emitting/source electrode local metal layer of the upper half-bridge switch chip electrically connected with the output power terminal and one upper half-bridge driving terminal, and a gate electrode local metal layer of the upper half-bridge switch chip electrically connected with another upper half-bridge driving terminal;

the upper half-bridge diode chip is sintered on a surface of the positive metal layer of the top metal insulating substrate, the lower half-bridge diode chip is sintered on a surface of the negative metal layer of the top metal insulating substrate, and the gate electrode local metal layer of the upper half-bridge switch chip is electrically connected with a gate electrode of the upper half-bridge switch chip;

the bottom metal insulating substrate comprises a positive metal layer of the bottom metal insulating substrate electrically connected with the positive power terminal, a negative metal layer of the bottom metal insulating substrate electrically connected with the negative power terminal and one lower half-bridge driving terminal, and a gate electrode local metal layer of the lower half-bridge switch chip electrically connected with another lower half-bridge driving terminal; and the upper half-bridge switch chip is sintered on a surface of the positive metal layer of the bottom metal insulating substrate, and the lower half-bridge switch chip is sintered on a surface of the negative metal layer of the bottom metal insulating substrate; and the gate electrode local metal layer of the lower half-bridge switch chip is electrically connected with a gate electrode of the lower half-bridge switch chip.

13. The low parasitic inductance power module according to claim 6, wherein the output power terminal further comprises an upper half-bridge leading-out terminal, the welding portion is connected with an emitter electrode or a source electrode of the upper half-bridge switch chip, connected with a collector electrode or a drain electrode of the lower half-bridge switch chip, connected with a positive electrode of the upper half-bridge diode chip, and connected with a negative electrode of the lower half-bridge diode chip; and the upper half-bridge leading-out terminal is connected with an emitting/source electrode local metal layer of the upper half-bridge switch chip of the top metal insulating substrate.

14. The low parasitic inductance power module according to claim 1, wherein each of stress buffer layers is filled between the welding portion of the output power terminal and each of the chips.

15. The low parasitic inductance power module according to claim 1, wherein the plastic package shell is manufactured by a transfer mold integrated molding process, and a middle part of an upper surface on a back metal layer of the top metal insulating substrate and a middle part of a lower surface of a back metal layer of the bottom metal insulating substrate are both exposed outside the plastic package shell, and are higher than the plastic package shell.

16. A double-faced heat-dissipation low parasitic inductance power module, comprising the low parasitic inductance power module according to claim 1, wherein a lower surface of the low parasitic inductance power module is provided with a heat radiator, an upper surface of the low parasitic inductance power module is provided with a plurality of heat pipes, the heat radiator is provided with a heat pipe insertion opening, the heat pipe comprises an evaporation section, the evaporation section is bent downwardly at an edge of the power module to form a connecting section, and the connecting section is inserted into the heat pipe insertion opening of the heat radiator and fixed.

17. The double-faced heat-dissipation low parasitic inductance power module according to claim 16, wherein the evaporation section of the heat pipe is sintered on the top metal insulating substrate; the evaporation section is wrapped in the plastic package shell; or, the evaporation section is exposed outside the plastic package shell, and the middle part of the upper surface of the top metal insulating substrate and the middle part of the lower surface of the bottom metal insulating substrate are exposed outside the plastic package shell.

18. The double-faced heat-dissipation low parasitic inductance power module according to claim 16, wherein the lower surface of the bottom metal insulating substrate is provided with a turbulence structure, an upper surface of the heat radiator is provided with a turbulence hole, the turbulence structure extends into the heat radiator through the turbulence hole and is sealed at an opening of the turbulence hole, to form a heat exchange channel for heat dissipation media in the heat radiator.

19. The low parasitic inductance power module according to claim 5, wherein the positive power terminal and the negative power terminal are both sintered on the top metal insulating substrate, and at least one input power terminal is connected with the bottom metal insulating substrate through a metal joint pin; or, the positive power terminal and the negative power terminal are both sintered on the bottom metal insulating substrate, and are connected with the top metal insulating substrate through a metal joint pin; or, the positive power terminal and the negative power terminal are sintered together with the top metal insulating substrate and the bottom metal insulating substrate; and the welding portion is located between the chip sintered on the top metal insulating substrate and the chip sintered on the bottom metal insulating substrate.

\* \* \* \* \*